(12) United States Patent
Mizushima

(10) Patent No.: US 8,677,213 B2
(45) Date of Patent: Mar. 18, 2014

(54) ELECTRONIC DEVICE COMPRISING ERROR CORRECTION CODING DEVICE AND ELECTRONIC DEVICE COMPRISING ERROR CORRECTION DECODING DEVICE

(75) Inventor: Nagamasa Mizushima, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 258 days.

(21) Appl. No.: 13/259,743

(22) PCT Filed: Sep. 16, 2011

(86) PCT No.: PCT/JP2011/005264
§ 371 (c)(1),
(2), (4) Date: Sep. 23, 2011

(87) PCT Pub. No.: WO2013/038464
PCT Pub. Date: Mar. 21, 2013

(65) Prior Publication Data
US 2013/0073925 A1    Mar. 21, 2013

(51) Int. Cl.
*G11C 29/00*    (2006.01)
*H03M 13/00*    (2006.01)

(52) U.S. Cl.
USPC ........... 714/763; 714/773; 714/774; 714/769; 714/781; 714/782; 714/785; 714/800

(58) Field of Classification Search
USPC ......... 714/763, 781, 782, 785, 769, 773, 774, 714/800
See application file for complete search history.

(56) References Cited

U.S. PATENT DOCUMENTS

| | | | |
|---|---|---|---|
| 4,555,784 A * | 11/1985 | Wood ........................... | 714/785 |
| 5,040,179 A | 8/1991 | Chen | |
| 5,140,596 A * | 8/1992 | Weldon, Jr. .................... | 714/762 |
| 6,574,774 B1 * | 6/2003 | Vasiliev ......................... | 714/800 |
| 7,472,333 B2 * | 12/2008 | Hu et al. ........................ | 714/781 |
| 7,793,197 B2 * | 9/2010 | Ito et al. ......................... | 714/784 |
| 2007/0157064 A1* | 7/2007 | Falik et al. ..................... | 714/755 |
| 2008/0022185 A1* | 1/2008 | Kiryu ............................. | 714/759 |
| 2010/0042907 A1 | 2/2010 | Pilsl | |

(Continued)

FOREIGN PATENT DOCUMENTS

WO    2004059851 A1    7/2004

OTHER PUBLICATIONS

Liu et al, "Low-Power High-Throughput BCH Error Correction VLSI Design for Multi-Level Cell NAND Flash Memories", IEEE Workshop on Signal Processing Systems Design and Implementation, Banff, Canada, Oct. 2, 2006, pp. 303-308.

(Continued)

*Primary Examiner* — John J Tabone, Jr.
(74) *Attorney, Agent, or Firm* — Volpe and Koenig, P.C.

(57) ABSTRACT

An electronic device comprises an error correction coding device. The error correction coding device comprises a parity code generator. This generator is a circuit for computing a remainder polynomial by dividing a user data polynomial by a generator polynomial and generating a parity code from this remainder polynomial. This generator computes the remainder polynomial by dividing and inputting either a bit string comprising coefficients of the generator polynomial, or a bit string comprising coefficients of the generator polynomial and a bit string comprising coefficients of the generator polynomial, and dividing a minimal unit multiple times based on either a division width of the user polynomial or a division width of the user polynomial and the generator polynomial, and outputs a bit string comprising the coefficient of this remainder polynomial.

13 Claims, 21 Drawing Sheets

(56) References Cited

U.S. PATENT DOCUMENTS

2010/0332956 A1    12/2010    Aldrod et al.
2011/0209029 A1*    8/2011    Zopf .......................... 714/758
2013/0061115 A1*    3/2013    Imai et al. .................. 714/763

OTHER PUBLICATIONS

Kwon et al, "A One Division per Clock Pipelined Division Architecture Based on LAPR(Lookahead of Partial-Remainder) for Low-power ECC Applications", 1997 International Symposium on Low Power Electronics and Design, IEEE, New York, NY, USA, Aug. 18, 1997, pp. 220-224.

Cherukuri, Raghunath, "Agile Encoder Architectures for Strength-Adaptive Long BCH Codes", 2010 GLOBECOM Workshops, IEEE, Piscataway, NJ, USA, Dec. 6, 2010, pp. 1900-1904.

* cited by examiner

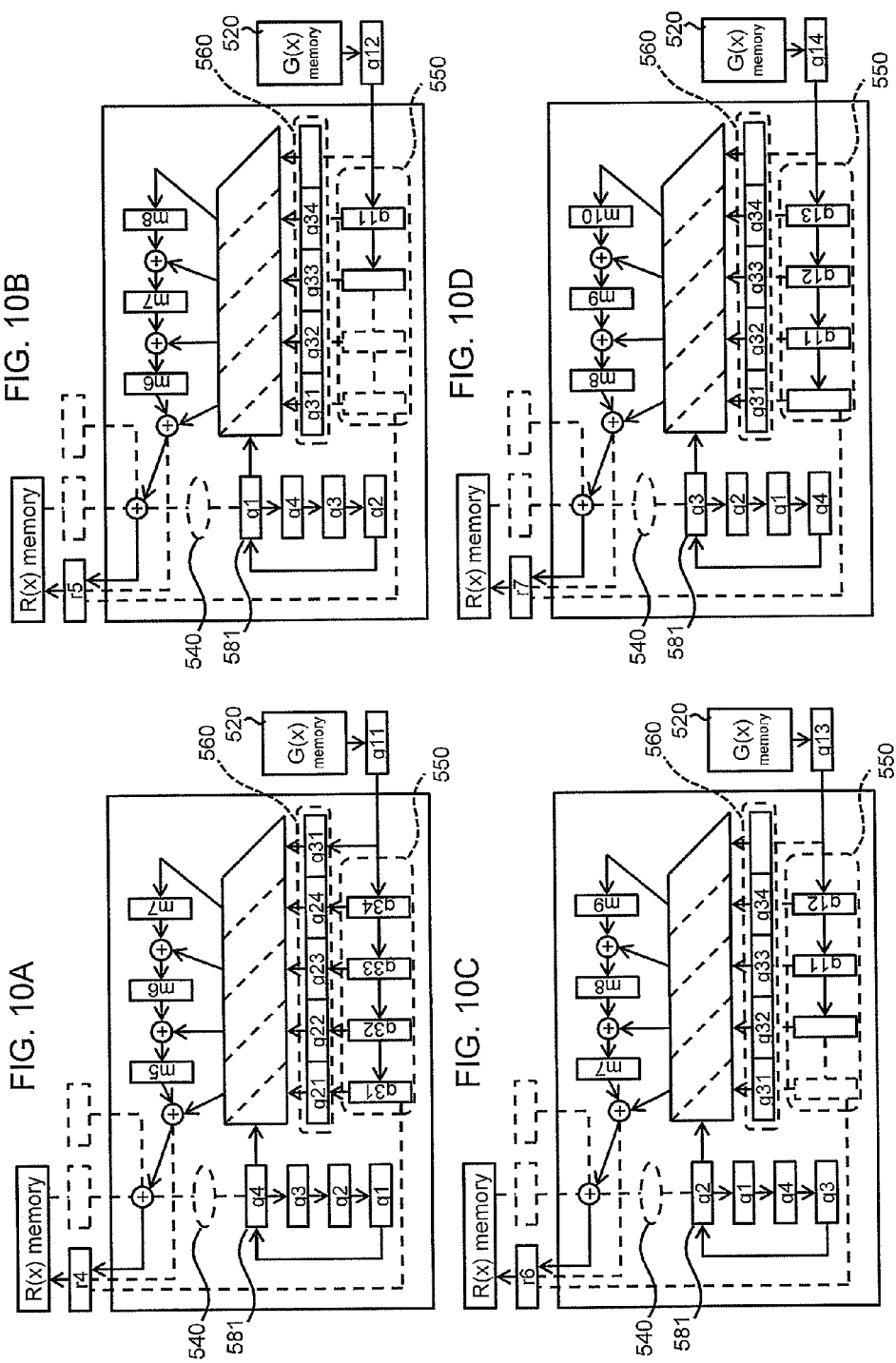

ELECTRONIC DEVICE COMPRISING ERROR CORRECTION CODING DEVICE AND ELECTRONIC DEVICE COMPRISING ERROR CORRECTION DECODING DEVICE

TECHNICAL FIELD

The present invention relates to error correction coding and decoding, and more particularly to generating and/or checking a parity code for error correction.

BACKGROUND ART

For example, a NAND-type flash memory or other such high-integration, high-capacity nonvolatile semiconductor memory is characterized by the fact that a portion of stored data becomes more susceptible to destruction (referred to as data error hereinafter) the more times rewriting is carried out. Normally, the percentage of data errors relative to all the stored data in a nonvolatile semiconductor memory is between 0.1 and 1.0%. This percentage increases as the number of rewrites increases.

In a case where a nonvolatile semiconductor memory like this is used, and, for example, configures a storage device such as a SSD (Solid State Drive), an ECC (Error Checking Correcting) processing part for checking and correcting a location where a data error has occurred is generally implemented as a dedicated hardware circuit in a memory controller inside the storage device.

The ECC process is divided into two processes: an ECC coding process for adding a parity code for error correction to user data to be recorded in a storage medium, and an ECC decoding process for using the added parity code to detect an error location when user data is read from the storage medium.

The ECC decoding process is divided into two processes: a parity checking process, and an error location computation process. The parity checking process computes a test value called a syndrome from the user data and the parity code, looks at this test value, and determines whether or not a data error exists. The error location computation process, in a case where it was determined that a data error exists in the parity checking process, further analyzes the test value and detects the location where the data error has occurred.

Generally speaking, the application of a cyclic code is often used in the ECC process. The most often used cyclic code is the BCH code (Bose Chaudhuri Hocquenghem Code).

When using a parity code generated by the BCH code, randomly generated bit errors in the user data can be corrected up to a preset maximum number (will be expressed as t). Adding a parity code with a length that is longer than t makes it possible to correct more errors. This t is called the number of error-correctable bits, and is a design parameter at the time the BCH code circuit is implemented.

Furthermore, a numerical computation in accordance with a Galois field $GF(2^m)$ with an element of $2^m$ is used in the BCH code as a positive integer m. The Galois field is a closed finite set in which four arithmetic operations are defined. This m is also a design parameter at the time the BCH code circuit is implemented.

In a Galois field $GF(2^m)$ with an element of $2^m$, the total of the user data and parity code bit length is found to be less than $2^m$ bits. The parity code bit length of the BCH code is stipulated as $m \times t$ using both of the design parameters. Consequently, the bit length k of the user data must satisfy:

$$k < 2^m - m \times t.$$

Furthermore, addition (+) and subtraction (−) in a Galois field differ from ordinary arithmetic addition (ADD) and arithmetic subtraction (SUB) in which there is carrying and borrowing, and both of these operations become exclusive OR (XOR) for each bit. That is, there is no distinction made between addition and subtraction from the standpoint of a computation, and the result of adding/subtracting the same value is 0 (X+X=0, X−X=0).

Next, a method for generating a parity code from the BCH code will be described.

First, a user data polynomial U(x) is created. When the bit string of the user data is $\{u_{k-1}, u_{k-2}, \ldots u_1, u_0\}$ the user polynomial U(x) is generated by respectively allocating each bit to the coefficient of a polynomial of degree (k−1), as shown below:

$$U(x) = u_{k-1}x^{k-1} + u_{k-2}x^{k-2} + \ldots u_1 x + u_0.$$

Next, a remainder polynomial R(x) is created.

The remainder polynomial R(x) is the following polynomial of degree (m×t−1), which is generated by dividing a value obtained by multiplying U(x) by $x^{mt}$ by a polynomial of degree (m×t), which is called a generator polynomial G(x):

$$R(x) = r_{mt-1}x^{mt-1} + r_{mt-2}x^{mt-2} + \ldots r_1 x + r_0.$$

The remainder polynomial is a parity polynomial, and each coefficient is a polynomial of either 1 or 0. Furthermore, each coefficient of the generator polynomial G(x) of the BCH code is either 1 or 0, and is uniquely stipulated in accordance with the design parameters m and t.

Lastly, these coefficients are returned to the bit string to produce the following bit string:

$$\{r_{mt-1}, r_{mt-2}, \ldots, r_1, r_0\}.$$

This bit string becomes the parity code.

Next, a specific method for generating the parity code from the BCH code will be described.

For example, in a case where the design parameters are m=6 and t=2, the BCH code generator polynomial is uniquely stipulated as:

$$G(x) x^{12} + x^{10} + x^8 + x^5 + x^4 + x^3 + 1.$$

When it is supposed that all the user data values are 1, and that the length is 40 bits (k=40)

$$\{11 \ldots 111\}$$

the user data polynomial becomes:

$$U(x) = x^{36} + x^{38} + \ldots x^2 + x + 1$$

The remainder obtained by dividing a value obtained by multiplying this by $x^{12}$ by G(x) becomes:

$$R(x) = x^{10} + x^9 + x^4 + x^3 + 1.$$

Consequently, the 12 bits $$\{011000011001\}$$

obtained by returning the respective coefficients to the bit string become the parity code.

As the prior art of a circuit for realizing the generation of a parity code from the BCH code as described hereinabove, for example, there are Patent Literature 1 and Patent Literature 2.

Patent Literature 1 is such that a lookup table showing the corresponding relationships from the user data polynomial U(x) to the parity polynomial R(x) is stored beforehand in ROM (READ Only Memory), and parity code generation is carried out at high speed by referring to this table. Using the above-mentioned design parameters, the size of the table is k×(m×t).

Patent Literature 2 is a technique that takes advantage of the fact that the generator polynomial G(x) can be factorized in a minimal polynomial $M_i(x)$ of t. For example, taking a case in which the above-mentioned G(x) is t=2 as an example, the G(x) can be factorized into two products, i.e., $M_1(x)=x^6+x+1$ and $M_3(x)=x^6+x^4+x^2+x+1$, but a computing unit is configured for carrying out division, which treats this minimal polynomial as a divisor, and multiplication for multiplying by $x^m$, and finds the parity polynomial R(x) by inputting the U(x) into a pipeline circuit that concatenates these operations into t steps. In the Patent Literature 2, the maximum number of error-correctable bits can be freely selected from 1 up to t with one type of circuit.

CITATION LIST

Patent Literature

PTL 1: U.S. Pat. No. 5,040,179 (Specification)
PTL 2: US Patent Application Publication No. 2010/0042907 (Specification)

SUMMARY OF INVENTION

Technical Problem

The percentage of data errors in a NAND-type flash memory (referred to as flash error characteristics hereinafter) will vary in accordance with the memory vendor and the type of product. Generally speaking, the flash error characteristics is the maximum number of error bits per sector unit (for example, a maximum of 40 bits per 1 KB).

Furthermore, semiconductor fabrication processes are being downscaled and multivalued memory cells are being fabricated to reduce the cost per bit of memory, trends that year after year are increasing data storage destabilizing factors and raising the percentage of data errors. Storage vendors who design memory controllers decide on the design parameters m and t by taking these factors into account.

Therefore, the problem, for example, is that each time the storage vendor changes to a lower-bit-cost flash memory for implementation in a storage, this vendor must go so far as to reconstruct the memory controllers (referred to simply as the memory controller hereinafter) that comprise generation circuits for generating parity codes (referred to as the parity code generation circuit hereinafter) to deal with (change the design parameters m and t of) the different flash error characteristics, thereby increasing costs.

The parity code generation circuit described in the Patent Literature 1 is designed to make the design parameters m and t fixed values. Therefore, in the Patent Literature 1, there is no mechanism for selecting the design parameters m and t from multiple patterns, and the storage vendor must reconstruct the memory controller in accordance with the flash error characteristics, resulting in higher costs.

Furthermore, since the design parameters for dealing with today's standard flash error characteristics are around m=14 and t=40, the size of the required lookup table becomes $(2^{14}-14\times40)\times(14\times40)=<8M$-bits. That is, in the Patent Literature 1, the problem is that the size of the circuit for a single parameter is already large, and development costs are getting higher.

Since the parity code generation circuit described in the Patent Literature 2 has a common circuit for multiple flash error characteristics (multiple numbers of correction bits), the size of the circuit for supporting multiple flash memories does not increase, but the problem is that because this circuit is designed so as to establish an upper limit for the design parameter m, user data having a length in excess of $(2^m-m\times t)$ cannot be supported. In addition, since the design also establishes an upper limit for the t, the problem is that a flash memory requiring greater than expected correction capabilities cannot be supported.

That is, the problems with the conventional parity code generation circuits are that the size of the circuit will exceed a practical range when the number of error characteristic patterns is larger than previously expected, and restrictions are placed on error characteristic patterns capable of being supported by the values of the estimated design parameters m and t.

Faced with these problems, measures could be taken to estimate future flash error characteristics and multiple patterns, create the multiple patterns by combining the design parameters m and t, and design a parity code generation circuit in accordance with these respective patterns. However, there may also be cases in which the flash error characteristics are not as expected.

A circuit (the parity code checker hereinbelow) for checking a parity code in accordance with the parity code generator is also necessary, and in the prior art, this parity code checker must be redesigned the same as the parity code generator each time there is a change in the design parameters m and t.

These things are not limited to the flash memory, but rather also occur with respect to other physical storage mediums (for example, HDD (Hard Disk Drive)) for writing data by assigning a parity code.

Therefore, an object of the present invention is to provide at least one of a parity code generator and a parity code checker capable of supporting arbitrary combinations of the design parameters m and t without increasing the size of the circuit.

Solution to Problem

An electronic device comprises an error correction coding device. The error correction coding device comprises a function (for example, a circuit) for inputting a data bit string from outside, an operation circuit for obtaining a remainder polynomial in accordance with a division operation using a generator polynomial, a function (for example, a circuit) for inputting from the outside a bit string comprising coefficients of the generator polynomial, a function (for example, a circuit) for outputting to the outside a bit string comprising coefficients of the remainder polynomial, and a function (for example, a circuit) for inputting from the outside a bit string comprising coefficients of the remainder polynomial. The operation circuit references a portion of the bit string comprising the coefficients of the generator polynomial, references a portion of the bit string comprising the coefficients of the remainder polynomial, and computes another portion of the bit string comprising the coefficients of the remainder polynomial. These functions (circuits) may be in a parity code generator for correcting a data error.

In addition, the error correction coding device (for example, the parity code generator) may simultaneously (substantially simultaneously) input from the outside the portion of a bit string comprising the coefficients of the remainder polynomial and output to the outside the other portion of the bit string comprising the remainder polynomial.

In addition, the operation circuit of the error correction coding device (for example, the parity code generator) may simultaneously (substantially simultaneously) reference the portion of the bit string comprising the generator polynomial and may input from the outside another portion of the bit string comprising the coefficients of the generator polynomial.

In addition, the function (for example, the circuit) of the error correction coding device (for example, the parity code generator) for inputting a data bit string from the outside, may continuously input the data bit string W bits at a time for N cycles, and the operation circuit may reference the bit string comprising the coefficients of the generator polynomial every (W×N) bits.

In addition, the error correction coding device (for example, the parity code generator) may comprise a register for storing multiple quotients obtained by division in accordance with the generator polynomial, and may supply the operation circuit with one of the multiple quotients from the register.

Furthermore, the error correction coding device, in addition to the above-mentioned parity code generator, for example, may comprise a first storage area (for example, a memory) for storing a bit string comprising the coefficients of the generator polynomial, and a second storage area (for example, a memory) for storing a bit string comprising the coefficients of the remainder polynomial.

In addition, the error correction coding device may comprise an external memory bus for inputting a bit string comprising the coefficients of the generator polynomial from the outside of the error correction coding device, and a switching circuit for switching the input source of a bit string comprising the coefficients of the generator polynomial to the outside of either an internal storage area (for example, either the above-mentioned first or second storage area) or the error correction coding device.

In addition, the error correction coding device may comprise an external memory bus for outputting a bit string comprising the coefficients of the remainder polynomial to the outside of the error correction coding device, and a switching circuit for switching the output destination of a bit string comprising the coefficients of the remainder polynomial to the outside of either an internal storage area (for example, either the above-mentioned first or second storage area) or the error correction coding device.

In addition, the error correction coding circuit may comprise an external memory bus for inputting from the outside of the error correction coding device a bit string comprising the coefficients of the remainder polynomial, and a switching circuit for switching the input source of a bit string comprising the coefficients of the remainder polynomial to the outside of either an internal storage area (for example, either the above-mentioned first or second storage area) or the error correction coding device.

The electronic device may comprise an error correction decoding device. The error correction decoding device may comprise a function (for example, a circuit) for inputting from the outside a data bit string, an operation circuit for obtaining a intermediate syndrome value from the data bit string, a function (for example, a circuit) for outputting to the outside the intermediate syndrome value, and a function (for example, a circuit) for inputting from the outside an intermediate syndrome value. The operation circuit may carry out updating by referencing a portion of the intermediate syndrome value. These functions (circuits) may be in a parity code checker for correcting a data error.

In addition, the error correction decoding device (for example, a parity code checker) may simultaneously (substantially simultaneously) input from the outside a portion of an intermediate syndrome value and output to the outside a portion of another intermediate syndrome value.

Furthermore, the error correction decoding device, in addition to the above-mentioned parity code checker, may comprise a storage area (for example, a memory) for storing an intermediate syndrome value.

In addition, the error correction decoding device may comprise an external memory bus for outputting an intermediate syndrome value to the outside of the error correction decoding device, and a switching device for switching the output destination of the intermediate syndrome value to the outside of either an internal storage area or the error correction decoding device.

In addition, the error correction decoding device may comprise an external memory bus for inputting an intermediate syndrome value from the outside of the error correction decoding device, and a switching device for switching the input source of the intermediate syndrome value to the outside of either an internal storage area or the error correction decoding device.

BRIEF DESCRIPTION OF DRAWINGS

FIG. 10A shows an internal state diagram during the 13th cycle of FIG. 5, FIG. 10B shows an internal state diagram during the 14th cycle of FIG. 5, FIG. 10C shows an internal state diagram during the 15th cycle of FIG. 5, and FIG. 10D shows an internal state diagram during the 16th cycle of FIG. 5.

DESCRIPTION OF EMBODIMENTS

An example of the present invention will be explained hereinbelow. Furthermore, in the following example, it is supposed that an electronic device is a device comprising a flash memory chip 130, but the present invention is not limited to such a device, and is applicable to all sorts of devices for generating and/or checking an error correction parity code.

Figure 1:
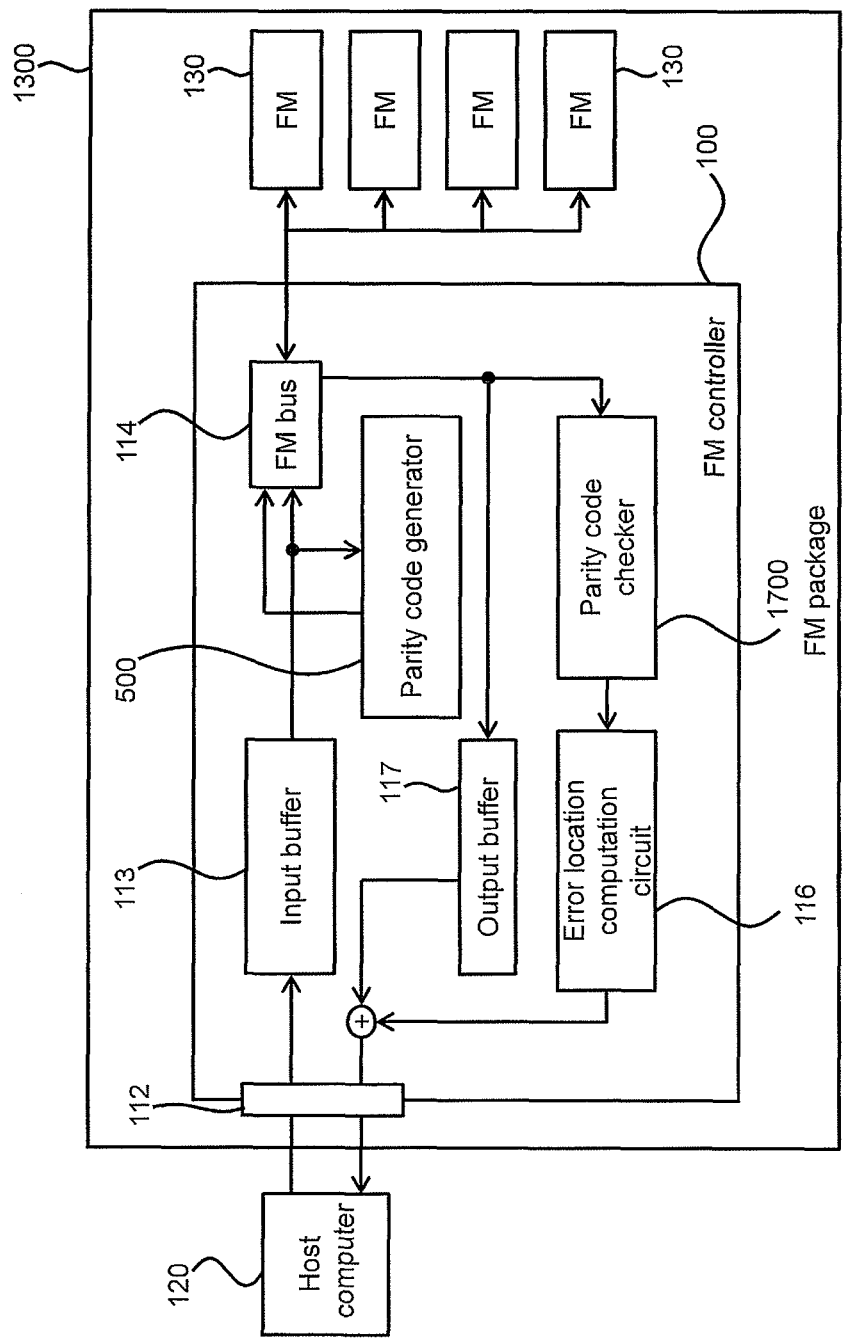
FIG. 1 shows an example of a block diagram of a system, which comprises an electronic device comprising an FM controller 100.

FIG. 1 shows an example of a block diagram of a system, which comprises an electronic device comprising a FM (Flash Memory) controller 100.

The electronic device is a flash memory device, and comprises a FM controller 100, and a recording medium that includes one or more FM chips 130, which are coupled to the FM controller 100. This electronic device may also be a FM storage device comprising a large number of FM chips 130.

The FM controller 100 is a semiconductor chip mounted with a microprocessor and peripheral logic circuits. The microprocessor controls the flash memory in accordance with various programs incorporated in the FM controller 100.

In the example shown in the drawing, the peripheral logic circuits include a parity code generator 500, a host interface 112, an input buffer 113, a FM bus 114, a parity code checker 1700, an error location computation circuit 116, and an output buffer 117.

The FM controller 100 is coupled to an external host computer 120 via the host interface 112. Furthermore, the FM controller 100 is coupled to one or more external flash memory chips 130 (abbreviated as FM hereinafter) via the FM bus 114. The FM controller 100 and one or more FM chips 130 configure an FM package 1300.

The host interface 112 is an interface mechanism conforming to a standard specification, such as SATA (Serial ATA) or SAS (Serial Attached SCSI), which is compatible with a hard disk device. The host interface 112 sends user data read from an FM chip 130 to the host computer 120 in response to a read/write command from the host computer 120, and receives user data to be stored in the FM chip 130 from the host 120.

The input buffer 113 is a buffer memory for temporarily storing user data received from the host computer 120 in accordance with a write command. The temporarily stored user data is sent from here to the FM bus 114 and the parity code generator 500. The user data sent to the FM bus 114 is data to be written to an FM chip 130. Alternatively, the data sent to the parity code generator 500 is data for computing a parity code to be added for error correction. The user data is written to the FM chip 130 in a state in which a parity code has been added.

The parity code generator 500 is a logic circuit for computing a parity code for correcting a user data error. The parity code computed by the parity code generator 500 is sent to the FM bus 114 from here. As was explained hereinabove, this is because the parity code is added to the user data corresponding to the parity code and written to the FM chip 130.

The FM bus 114 is an interface mechanism corresponding to a standard flash memory chip specification such as ONFI (Open NAND Flash Interface). The FM bus 114 sends a read command to the FM chip 130, and reads the user data and the parity code added to this user data from the FM chip 130. The read user data and parity code are sent to the parity code checker 700 This checker 1700 is for checking the parity code. In addition, the read user data is also sent to the output buffer 117. This is for correcting a user data error and sending the corrected data to the host 120. Furthermore, the FM bus 114 sends a write command to the FM chip 130, and writes the user data and the parity code that has been added to the user data to the FM chip 130.

The parity code checker 1700 is a logic circuit for checking a parity code for correcting a user data error. A test value called a syndrome is computed when checking the parity code. A case where all the syndrome values are 0 signifies that there are no errors in the user data. The syndrome is sent from the parity code checker 1700 to the error location computation circuit 116.

The error location computation circuit 116 is a logic circuit for computing an error location from a syndrome. In a case where the syndrome value is not zero, that is, when there is an error in the user data, this error location computation circuit 116 analyzes the syndrome value and computes the location of the error. In addition, the error location computation circuit 116 outputs a correction bit string such that only the computed error location bit has a value of 1 and the other bits all have a value of 0. Alternatively, in a case where there is no error in the user data, the error location computation circuit 116 outputs a correction bit string such that the values of all the bits become 0 without computing an error location.

The output buffer 117 is a buffer memory for temporarily storing user data to be sent to the host 120 in accordance with a read command. A user data error is corrected by performing an exclusive OR (XOR) operation for each bit between the user data bit string outputted from the output buffer 117 and the correction bit string outputted from the error location computation circuit 116. The user data corrected in this way is sent to the host computer 120 through the host interface 112.

In addition to the above, internal RAM (Random Access Memory) not shown in the drawing is included in the FM controller 100 for storing the data and so forth used in flash memory control and user data error correction. Furthermore, the FM controller 100 can also be configured such that external RAM (for example, DRAM: Dynamic RAM) is able to be connected. Data and so forth used in flash memory control and user data error correction can also be stored in the external RAM the same as the internal RAM.

Next, a method for computing the steps for parity code generation will be explained by referring to FIG. 2.

Figure 2:
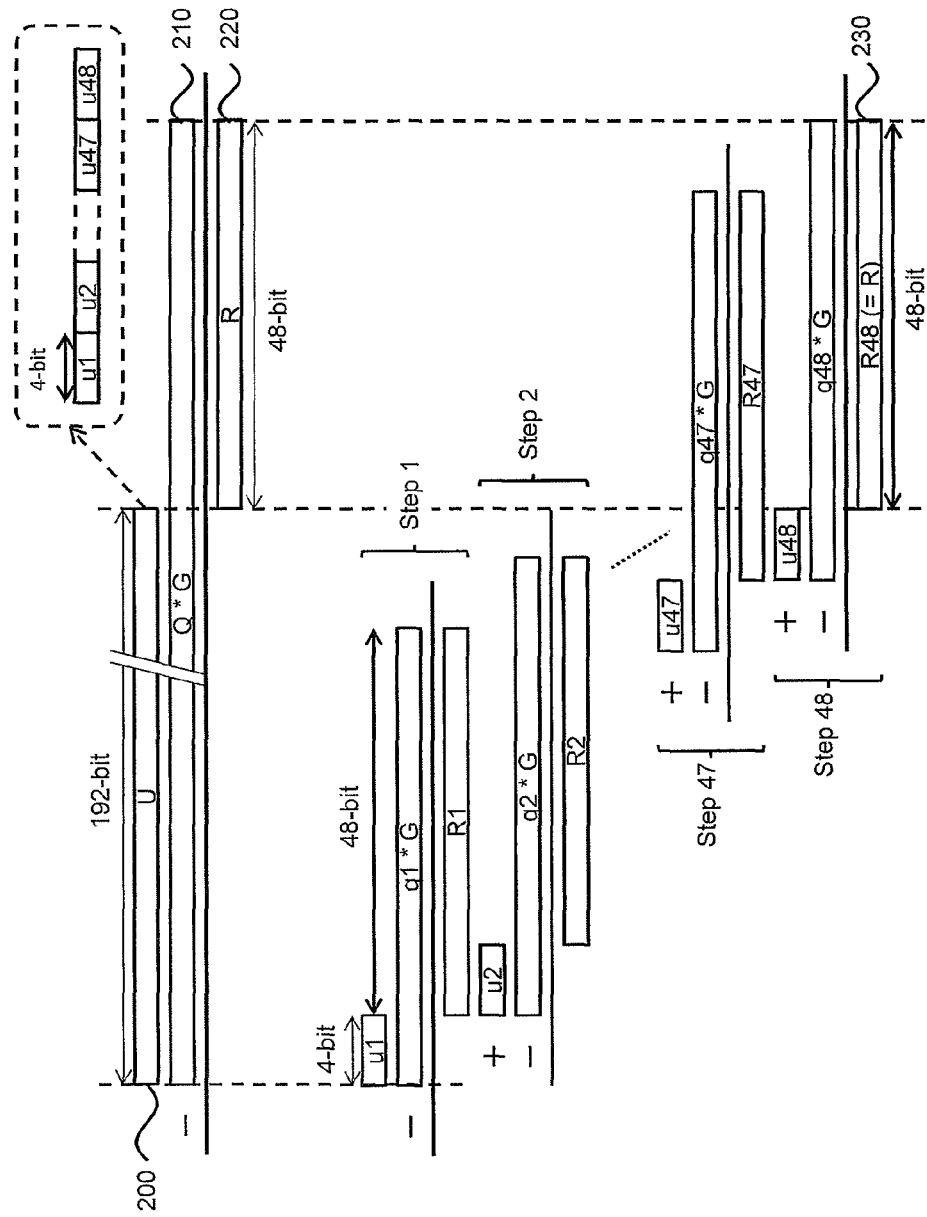
FIG. 2 is a diagram showing an example of a computation method for generating a parity code.

FIG. 2 is a diagram showing an example of a computation method for generating a parity code.

In flash memory error correction using a BCH code, the length k of the user data and the maximum number of error bits t capable of being generated therefrom are established based on error characteristics specific to the memory chip. Then, a parameter m, which satisfies $k<2^m-m\times t$, is established. The m and t, which are the design parameters, are fixed, a minimal polynomial of degree m $$Mi(x)=(x-a^i)(x-a^{2i})(x-a^{4i})\ldots(x-a^{\wedge}(2^{m-i}i))$$

is used to resolve for the element a of a Galois field $GF(2^m)$, and a generator polynomial (G(x) of degree (m×t)) is configured using the following equation:

$$G(x)=M_1(x)\times M_3(x)\times\ldots\times M_{2t-1}(x).$$

The generation of a parity code is a computation for finding a parity polynomial R(x) of degree (m×t−1) using a computation for finding a remainder by multiplying a user data polynomial U(x) of degree (k−1) by $x^{mt}$, and dividing this product by G(x):

$$U(x)\times x^{mt}=Q(x)\times G(x)+R(x).$$

Furthermore, in a case where the data written to the FM chip 130 is expressed in accordance with a polynomial, the equation becomes a codeword polynomial V(x) of degree (k−1+m×t), which links U(x) and R(x) as follows:

$$V(x)=U(x)\times x^{mt}+R(x).$$

FIG. 2 is an example of parity code generation, and shows a case in which m=8, t=6, and the user data bit length is k=192. This k satisfies the equation $k<2^m-m\times t=256-48=208$. A $47^{th}$ degree remainder polynomial R(220), which was obtained by dividing a $239^{th}$ degree polynomial obtained by multiplying a $191^{st}$ degree user data polynomial (200) by $x^{48}$ by a $48^{th}$ degree generator polynomial G, is the parity polynomial. Furthermore, a $191^{st}$ degree quotient polynomial Q is determined such that in Q×G (210), which is the product obtained by multiplying this quotient by G, the 192 coefficients from the higher-level terms become the same coefficients as that of the user data polynomial U.

As is clear from the relational expression $k<2^m-m\times t$, the upper limit of the user data bit length k becomes exponentially larger with respect to m. Therefore, there is the fear that designing a circuit to carry out parity code generation with arithmetic units and tables that are proportional in size to k will result in the circuit becoming dramatically large in size. Consequently, as described hereinbelow, a method is employed in which the user data is divided into small size data portions, and the divided user data is repeatedly inputted to a small-scale circuit. Since the degree of user data can be reduced by dividing this data into small portions, the size of the circuit for carrying out parity code generation can be made smaller.

For example, as shown in FIG. 2, the 192-bit user data U is divided into 48 data portions (u1, u2, . . . u47, u48) of W bits (for example, W=4) each. The bit string of each data portion is regarded as W (=4) coefficients of a (W=1) degree (=$3^{rd}$ degree) polynomial, and configures 48 partial polynomials as in the following equation. That is, from $$U(X)=u_{191}x^{191}+u_{190}x^{190}+\ldots+u_1x+u_0$$

there is configured:

$$u1(x)=u_{191}x^3+u_{190}x^2+u_{189}x+u_{188}$$

$$u2(x)=u_{182}x^3+u_{186}x^2+u_{185}x+u_{184}$$

...

$$u47(x)=u_7x^3+u_6x^2+u_5x+u_4$$

$$u48(x)=u_3x^3+u_2x^2+u_1x+u_0.$$

An operation circuit, which adds a $51^{st}$ degree polynomial obtained by multiplying a third degree polynomial by $x^{48}$ to a $51^{st}$ degree polynomial obtained by multiplying a $47^{th}$ degree polynomial by $x^4$, divides this sum by a $48^{th}$ degree generator polynomial G, and finds a $47^{th}$ degree remainder polynomial r'

$$u\times x^{48}+r\times x^4=q\times G+r'$$

will be considered here.

A parity code polynomial R(230) can be generated in this circuit by repeating the computation 48 times while sequentially inputting the above-mentioned partial polynomials (u (u1, u2, u3, . . . )×$x^{48}$) and the remainder polynomials r' (R1, R2, R3, . . . ) that were determined previously. Grouped together and transcribed, the above-mentioned computations read as follows:

START: U→{u1,u2, . . . ,u47,u48}

Step 1: $u1\times x^{48}+0\times x^4=q1\times G+R1$

Step 2: $u2\times x^{48}+R1\times x^4=q2\times G+R2$

Step 3: $u3\times x^{48}+R2\times x^4=q3\times G+R3$

Step 4: $u4\times x^{48}+R3\times x^4=q4\times G+R4$

Step 5: $u5\times x^{48}+R4\times x^4=q5\times G+R5$

Step 6: $u6\times x^{48}+R5\times x^4=q6\times G+R6$

Step 7: $u7\times x^{48}+R6\times x^4=q7\times G+R7$

Step 8: $u8\times x^{48}+R7\times x^4=q8\times G+R8$

...

Step 47: $u47\times x^{48}+R46\times x^4=q47\times G+R47$

Step 48: $u48\times x^{48}+R47\times x^4=q48\times G+R48$

END: R=R48.

The parity code generator related to this example generates a parity code by further processing the algorithm on the basis of these computation steps.

(*) Equally divides user data comprising k bits by W (where W is an integer of equal to or larger than 1).

(*) Configures k/W partial polynomials by regarding the bit string of each data portion as the coefficient of a (W−1) degree polynomial.

(*) Divides each k/W number of partial polynomials by N (where is an integer of equal to or larger than 1) and creates one set of k/NW partial polynomials.

(*) Divides a generator polynomial of degree mt by NW, and divides this quotient into D (where D=mt/NW) groups.

The parity code generator uses the divided user data polynomials and the divided generator polynomials computed in this manner, to compute a remainder polynomial by carrying out N sets of computations of partial remainder polynomials having k/N times as one set. The partial division of D×N is carried out in each set.

FIG. 2 shows a case in which k=192, m=8, t=6, W=4, and N=4. In FIG. 2, the 192-bit (k=192) user data U is first divided into 48 data portions (u1, u2, ... u47, u48) of W bits (for example, W=4) each. Forty-eight (48) partial polynomials are configured as in the formulas hereinbelow by regarded the bit string of each data portion as W (=4) coefficients of a (W−1) degree (=$3^{rd}$ degree) polynomial.

Then, the above-mentioned 48 (k/W) steps (Step 1 through Step 48) are divided by N steps. In a case where N=4, the above-mentioned 48 steps are divided into 12 steps. These 12 steps are treated as a single set, and computation is carried out in 4 set (N set) portions.

Next, a number of bits obtained by multiplying the user data division unit W by this N (=N×W=4×4=16 bits) is treated as a unit, and the 48 (m=8, t=6) bit strings of the generator polynomial G are also divided into three (mt/NW=3) groups. Then, the division within a single step is divided into D (=3) partial divisions in accordance with each group. At this time, computation can be performed for each set by carrying out partial division D×N=3×4=12 times.

A parity code will be generated hereinbelow by changing the sequence of these partial divisions from the sequence shown in FIG. 2.

Furthermore, in FIG. 2, there are arithmetic operators denoted as "+" and "−", but since these operations conform to exclusive OR, the answer will be the same for a "+" and a "−".

A parity code generation computation method that uses a parity code generator will be explained by referring to FIGS. 3 and 4.

Figure 3:
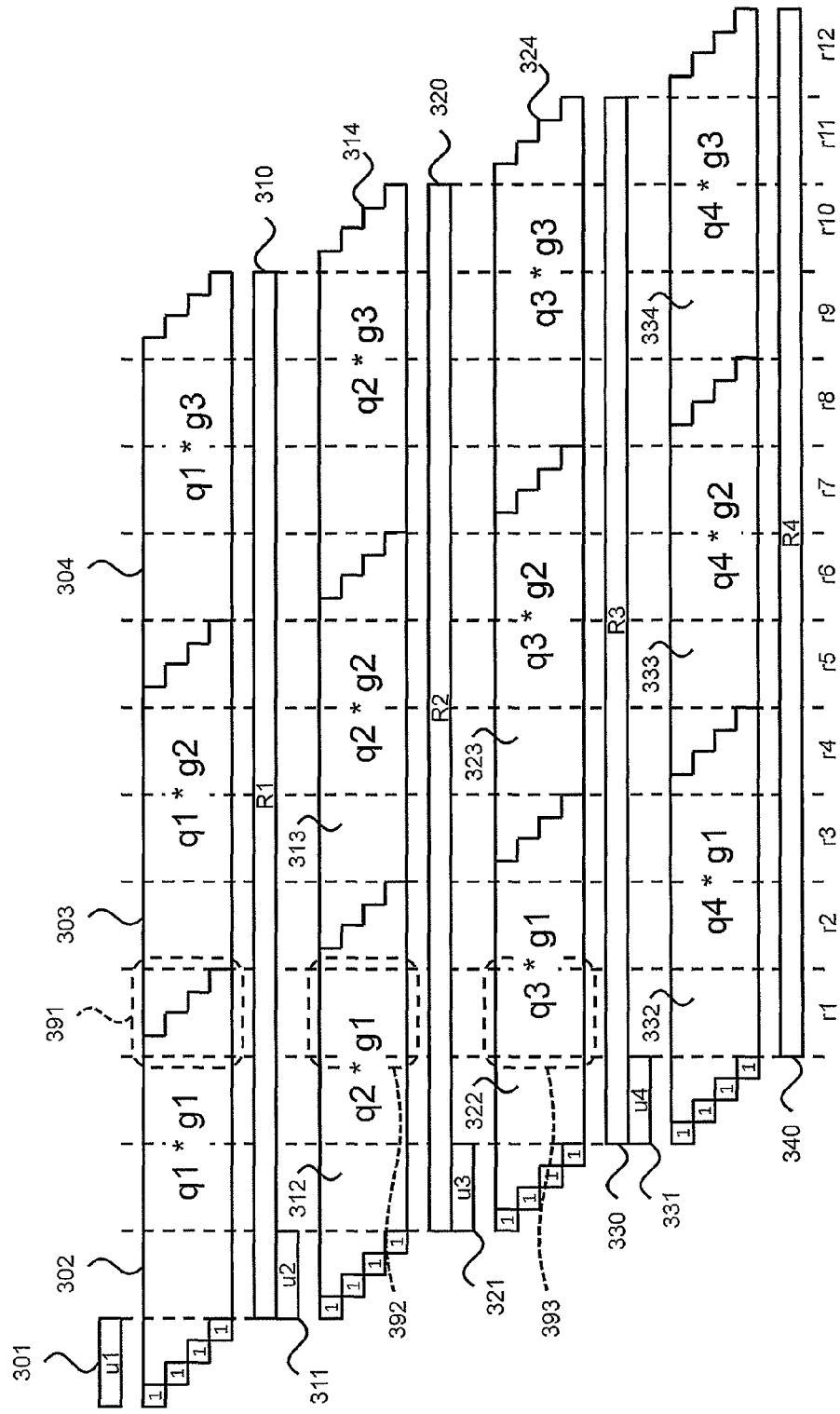
FIG. 3 shows the Steps 1 through 4 of FIG. 2 as a set of division operations for finding a remainder polynomial R4.

FIG. 3 shows the above-described Steps 1 through 4 as a set of division operations for finding a remainder polynomial R4. FIG. 4 is a continuation thereof showing the above-described Steps 5 through 8 as a set of division operations for finding the next remainder polynomial R8 from the remainder polynomial R4.

The example shown in FIG. 2 is one in which the remainder polynomial is computed by dividing only the user data polynomial. The examples shown in FIGS. 3 and 4 are examples for computing a remainder polynomial by dividing the user data polynomial and the generator polynomial.

First, 48 coefficients of the 49 coefficients of the $48^{th}$ degree generator polynomial G, with the exception of the coefficient $G_{48}=1$ of the higher-order $x^{48}$, are equally divided into the following three groups:

g1: 16-term coefficients $x^{47}$ through $x^{32}$ ($G_{47}$ through $G_{32}$)
g2: 16-term coefficients $x^{31}$ through $X^{16}$ ($G_{31}$ through $G_{16}$)
g3: 16-term coefficients $x^{15}$ through $x^0$ ($G_{15}$ through $G_0$).

In accordance with this, in FIG. 3, the above-described Step 1 corresponds to computations that:

(*) Obtain a quotient q1 by dividing u1 (301) by g1.
(*) Subtract q1×g1 (302), q1×g2 (303), and q1×g3 (304) from u1 (301).
(*) Obtain the remainder R1 (310).

By dividing the generator polynomial G into three equal parts, partial division must be carried out three times to obtain the remainder R1 (310).

In FIG. 3, the above-described Step 2 corresponds to computations that:

(*) Obtain a quotient q2 by dividing a sum obtained by adding u2 (311) to R1 (310) by g1.
(*) Subtract q2×g1 (312), q2×g2 (313), and q2×g3 (314) from the sum obtained by adding u2 (311) to R1 (310).
(*) Obtain the remainder R2 (320).

Partial division must be carried out three times in Step 2 as well.

In FIG. 3, the above-described Step 3 corresponds to computations that:

(*) Obtain a quotient q3 by dividing a sum obtained by adding u3 (321) to R2 (320) by g1.
(*) Subtract q3×g1 (322), q3×g2 (323), and q3×g3 (324) from the sum obtained by adding u3 (321) to R2 (320).
(*) Obtain the remainder R3 (330).

Partial division must also be carried out three times in Step 3.

In FIG. 3, the above-described Step 4 corresponds to computations that:

(*) Obtain a quotient q4 by dividing a sum obtained by adding u4 (331) to R3 (330) by g1.
(*) Subtract q4×g1 (332), q4×g2 (333), and q4×g3 (334) from the sum obtained by adding u4 (331) to R3 (330).
(*) Obtain the remainder R4 (340).

Partial division must also be carried out three times in Step 4.

In the above computations, since partial division is carried out three times per step, 12 partial divisions are included in the four steps (one set). These 12 partial divisions will be carried out hereinbelow by changing the sequence. Furthermore, in the following explanation, the result of dividing the coefficients of the remainder R4 in FIG. 3 into a set of 12 in units of four bits from the leftmost coefficient is expressed as {r1, r2, r3, ... r10, r11, r12}. Furthermore, in each of the following computations, it is supposed that a range related to each computation is subtracted from a stored remainder polynomial, but all the "subtraction values" in each computation can be added together and subtracted from the remainder polynomial all together.

(*) Obtain a quotient q1 by dividing u1 by g1.
(*) Subtract the range related to r1 obtained using q1×g1 (302) and q1×g2 (303).
(*) Obtain a quotient q2 by dividing u2 by g1.
(*) Subtract the range related to r1 through r2 obtained using q2×g1 (312) and q2×g2 (313).
(*) Obtain a quotient q3 by dividing u3 by g1.
(*) Subtract the range related to r1 through r3 obtained using q3×g1 (322) and q3×g2 (323).
(*) Obtain a quotient q4 by dividing u4 by g1.
(*) Subtract the range related to r1 through r4 obtained using q4×g1 (332) and q4×g2 (333).
(*) "Divide u1 by g2"
(*) Subtract the range related to r2 through r5 obtained using q1×g2 (303) and q1×g3 (304).
(*) "Divide u2 by g2"
(*) Subtract the range related to r3 through r6 obtained using q2×g2 (313) and q2×g3 (314).
(*) "Divide u3 by g2"
(*) Subtract the range related to r4 through r7 obtained using q3×g2 (323) and q3×g3 (324).
(*) "Divide u4 by g2"
(*) Subtract the range related to r5 through r8 obtained using q4×g2 (333) and q4×g3 (334).
(*) "Divide u1 by g3"
(*) Subtract the range related to r6 through r9 obtained using q1×g3 (304).
(*) "Divide u2 by g3"
(*) Subtract the range related to r7 through r10 obtained using q2×g3 (314).
(*) "Divide u3 by g3"
(*) Subtract the range related to r8 through r11 obtained using q3×g3 (324).
(*) "Divide u4 by g4"

(*) Subtract the range related to r9 through r12 obtained using q4×g3 (334).

(*) Obtain the remainder R4 (340).

In accordance with a sequence of partial divisions such as this, the remainders R1, R2, R3, which were computed between each step of the element computation method, are not computed, but the same ultimate remainder R4 as that in the above-described Step 4 can be correctly computed. Since using this partial division sequence makes it possible to carry out partial division by dividing the computations into a "computation using generator polynomial g1", a "computation using generator polynomial g2", and a "computation using generator polynomial g3", the storing of generator polynomials that are not used in the computations in the register inside the parity code generator 500, which will be described further below, can be prevented. Therefore, it is possible to enhance the efficiency of the computations of the parity code generator 500. Furthermore, the capacity of the register can be held to the minimum, thereby making it possible to reduce the size of the parity code generator 500.

Figure 4:
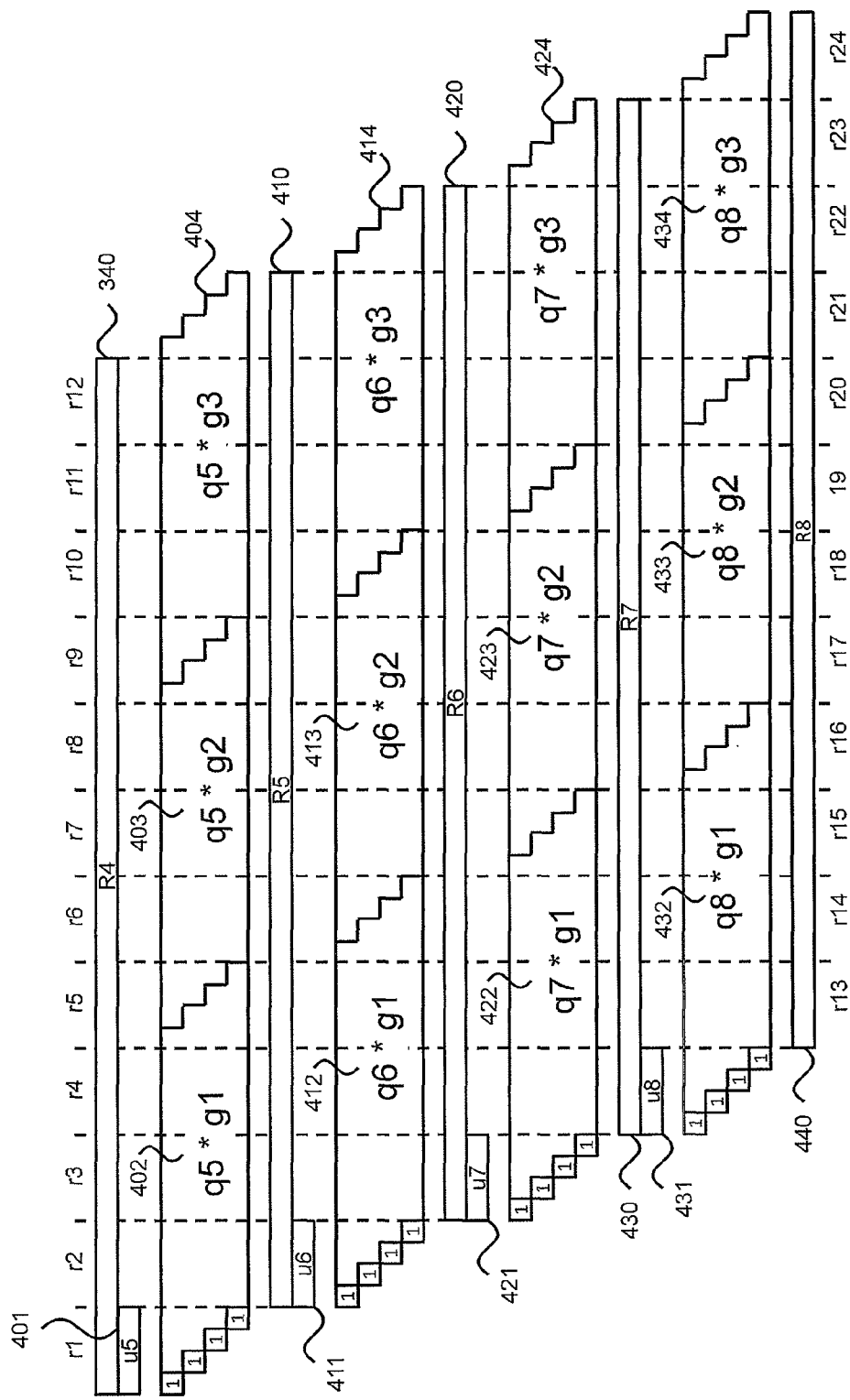
FIG. 4 shows the Steps 5 through 8 of FIG. 2 as a set of division operations for finding the next remainder polynomial R8 from the remainder polynomial R4.

Similarly, in FIG. 4, the above-described Step 5 corresponds to computations that:

(*) Obtain a quotient q5 by dividing a sum obtained by adding u5 (401) to R4 (340) by g1.

(*) Subtract q5×g1 (402), q5×g2 (403), and q5×g3 (404).

(*) Obtain the remainder R5 (410).

In FIG. 4, the above-described Step 6 corresponds to computations that:

(*) Obtain a quotient q6 by dividing a sum obtained by adding u6 (411) to R5 (410) by g1.

(*) Subtract q6×g1 (412), q6×g2 (413), and q6×g3 (414).

(*) Obtain the remainder R6 (420).

In FIG. 4, the above-described Step 7 corresponds to computations that:

(*) Obtain a quotient q7 by dividing a sum obtained by adding u7 (421) to R6 (420) by g1.

(*) Subtract q7×g1 (422), q7×g2 (423), and q7×g3 (424).

(*) Obtain the remainder R7 (430).

In FIG. 4, the above-described Step 8 corresponds to computations that:

(*) Obtain a quotient q8 by dividing a sum obtained by adding u8 (431) to R7 (430) by g1.

(*) Subtract q8×g1 (432), q8×g2 (433), and q8×g3 (434).

(*) Obtain the remainder R8 (440).

The parity code generator in this example performs the 12 partial divisions included within the above four steps by changing the sequence as follows. However, the result of dividing the coefficients of the remainder R8 in FIG. 4 into a set of 12 in units of four bits from the leftmost coefficient is expressed as {r13, r14, r15, ... r22, r23, r24}.

(*) Obtain a quotient q5 by dividing by g1.

(*) Subtract a range related to r13 obtained using q5×g1 (402) and q5×g2 (403).

(*) Obtain a quotient q6 by dividing by g1.

(*) Subtract the range related to r13 through r14 obtained using q6×g1 (412) and q6×g2 (413).

(*) Obtain a quotient q7 by dividing by g1.

(*) Subtract the range related to r13 through r15 obtained using q7×g1 (422) and q7×g2 (423).

(*) Obtain a quotient q8 by dividing by g1.

(*) Subtract the range related to r13 through r16 obtained using q8×g1 (432) and q8×g2 (433).

(*) Subtract a ranges related to r14 through r17 obtained using q5×g2 (403) and q5×g3 (404).

(*) Subtract the range related to r15 through r18 obtained using q6×g2 (413) and q6×g3 (414).

(*) Subtract the range related to r16 through r19 obtained using q7×g2 (423) and q7×g3 (424).

(*) Subtract the range related to r17 through r20 obtained using q8×g2 (433) and q8×g3 (434).

(*) Subtract a range related to r18 through r21 obtained using q5×g3 (404).

(*) Subtract the range related to r19 through r22 obtained using q6×g3 (414).

(*) Subtract the range related to r20 through r23 obtained using q7×g3 (424).

(*) Subtract the range related to r21 through r24 obtained using q8×g3 (434).

(*) Obtain the remainder R8 (440).

Similar to above, the remainders R5, R6, R7, which were computed between each step of the element computation method, are not computed, but the same ultimate remainder R8 as that in the above-described Step 8 can be correctly computed.

Figure 5:
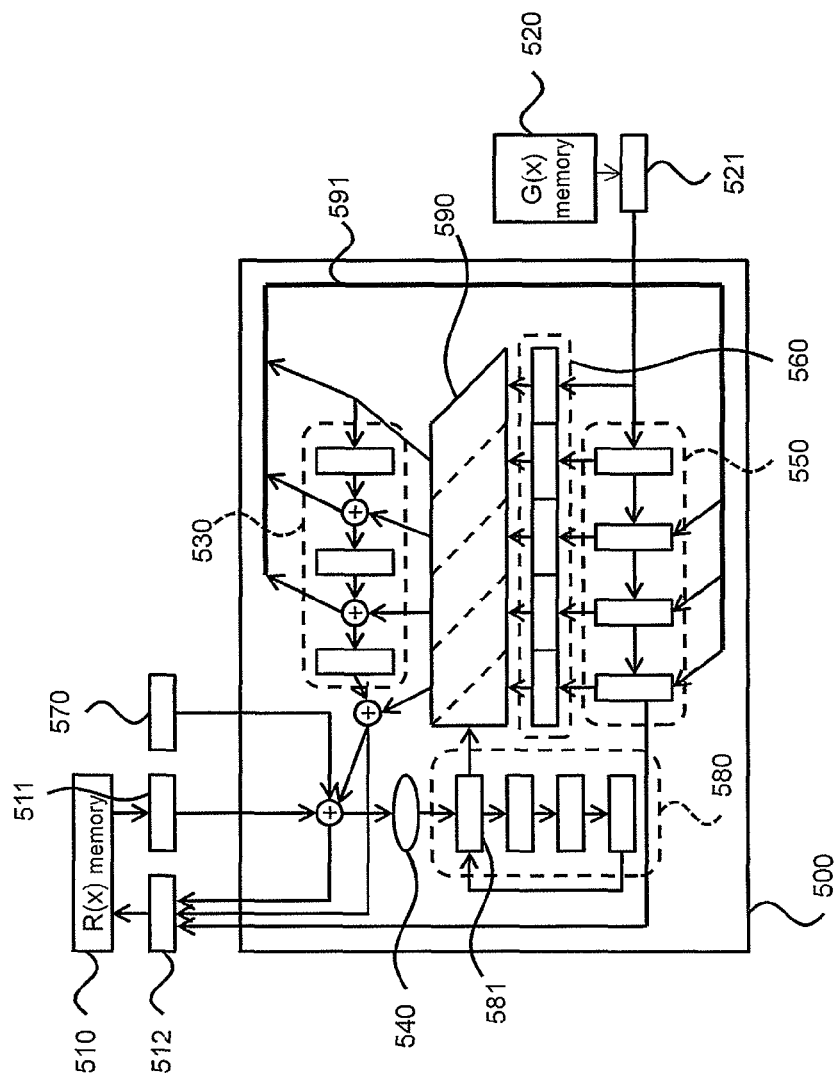
FIG. 5 shows an example of a block diagram of an error correction coding device comprising a parity code generator 500.

FIG. 5 shows an example of a block diagram of an error correction coding device comprising the parity code generator 500.

The configuration of the parity code generator 500 for carrying out the parity code generation computations explained using FIGS. 3 and 4 will be explained by referring to FIG. 5.

The parity code generator 500 comprises an intermediate value register 530, a quotient computation circuit 540, a generator polynomial shift register 550, a generator polynomial reference register 560, and a quotient shift register 580. A R(x) memory 510, a G(x) memory 520, and a user data input register 570 are coupled to the parity code generator 500.

Looking at the computation steps for generating a parity code in this example, it is clear that each time one of the multiple (12 times) partial divisions included in a single set is carried out, the coefficients of the remainder polynomials (R4 and R8) are fixed in order in W (=4) bit units (as in r1→r2→→ ... →r12, r13→r14→ ... →r24) from the leftmost coefficient. This is derived by dividing the coefficients of the generator polynomial G into groups of 16 (N×W) bit units. The parity code generator 500 takes advantage of this property to configure a parity code in W (=4) bit units using a pipeline circuit that carries out computations in sequence.

The parity code generator 500 is coupled to four data input/output registers (each w(=4) bits). That is, the user data input register 570, a generator polynomial input register 521, a parity code input register 510, and a parity code output register 512. The data input register 570 and the generator polynomial input register 521 may be collectively referred to herein as an input part, with the data input register 570 being referred to a first input part and the generator polynomial input register 521 being referred to as a second input part. The parity code output register 512 may be referred to herein as a first output part.

The user data input register 570 is for receiving user data from the input buffer 113 of FIG. 1 in units of four bits, and supplying the user data in units of four bits to the parity code generator 500.

The G(x) memory 520 is configured using RAM and stores the coefficients of a 48-bit generator polynomial (with exception of the coefficient of the highest-order term). The generator polynomial input register 521 coupled thereto is for reading the generator polynomial coefficients from the G(x) memory 520 in units of four bits, and supplying these coefficients to the parity code generator 500 in units of four bits.

The R(x) memory 510 is configured using RAM and stores the coefficients of the 48-bit remainder polynomial. The parity code output register 512 coupled to the R(x) memory 510 is for storing the coefficients of the remainder polynomials (R4 and R8) outputted from the parity code generator 500 in units of four bits, and writing these coefficients to the R(x) memory 510 in units of four bits. Similarly, the parity code input register 511 coupled to the R(x) memory 510 is for receiving the coefficients of the remainder polynomials (R4 and R8) read from the R(x) memory 510 in units of four bits, and inputting these coefficients to the parity code generator 500 in units of four bits. In particular, since these reads are generated simultaneously (substantially simultaneously), the R(x) memory 510 is a dual-port RAM.

The parity code generator 500 comprises a partial product computation circuit 590 as a combination circuit for finding a partial product such as q1×g1 (302), which is used in the partial division, and comprises four types of registers peripheral to the partial product computation circuit 590, i.e., the intermediate value register 530, the generator polynomial reference register 560, the generator polynomial shift register 550, and the quotient shift register 580. The partial product computation circuit 590, the intermediate value register 530, the polynomial reference register 560, the generator polynomial shift register 550, the quotient shift register 580, and the quotient computational circuit 540 (which is described in more detail below) may be collectively referred to herein as a first operation part.

The intermediate value register 530 is three 4-bit (W×(N−1)) registers, and comprises an adder (XOR) at each output destination. The intermediate value register 530 stores the values during the computation of the coefficients (r1 through r12 and r13 through r24) of the remainder polynomials (R4 and R8). This register also stores the values during the computation of the quotients (q3 through q4 and q7 through q8).

The generator polynomial reference register 560 is four (W×N) 4-bit registers and one 3-bit ((W−1)×1) register for providing each coefficient group (g1 through g3) of the generator polynomial G to the partial product computation circuit 590.

The generator polynomial shift register 550 is for coupling to the generator polynomial input register 521, and preparing each coefficient group to be set in the generator polynomial reference register 560 beforehand. This register also stores the results of computations of the coefficients (r10 through r12 and r22 through r24) of the remainder polynomials (R4 and R8). For this reason, the generator polynomial shift register 550 comprises a special input data bus 591 for receiving the same input as the input to the respective 4-bit registers of the intermediate value register 530.

The quotient shift register 580 is four (W×N) 4-bit cyclic shift registers for storing computed quotients (q1 through q4 and q5 through q8). One of the quotient reference registers 581 therein provides quotients (q1 through q4 and q5 through q8) for referring to the partial product computation circuit 590. A quotient computation circuit 540, which determines a quotient in accordance with a matrix computation prior to the input of the quotient reference register 581, is provided.

The quotient computation circuit 540 is a combination circuit for multiplying an inverse matrix:

1 $G_{47}$ $G_{46}+G_{47}$ $G_{45}+G_{47}$
0 1 $G_{47}$ $G_{46}+G_{47}$
0 0 1 $G_{47}$
0 0 0 1 of a 4×4 (W×W) matrix fixed in accordance with the coefficients $G_{48}$ (=1), $G_{47}$, $G_{46}$, $G_{45}$ of the terms of degree 48 through 45 of the generator polynomial G:

1 $G_{47}$ $G_{46}$ $G_{45}$
0 1 $G_{47}$ $G_{46}$
0 0 1 $G_{47}$
0 0 0 1 by a 4-bit input vector, and computing a 4-bit quotient (q1 through q4 and q5 through q8). Since this computation depends on the three coefficients $G_{47}$, $G_{46}$, and $G_{45}$ of the generator polynomial G, the configuration is such that these three coefficients are read from the G(x) memory 520, and stored in a different 3-bit (W-1 bit) register (omitted from FIG. 5) prior to the start of parity code generation so as to be referred to by the quotient computation circuit 540.

Figure 6:
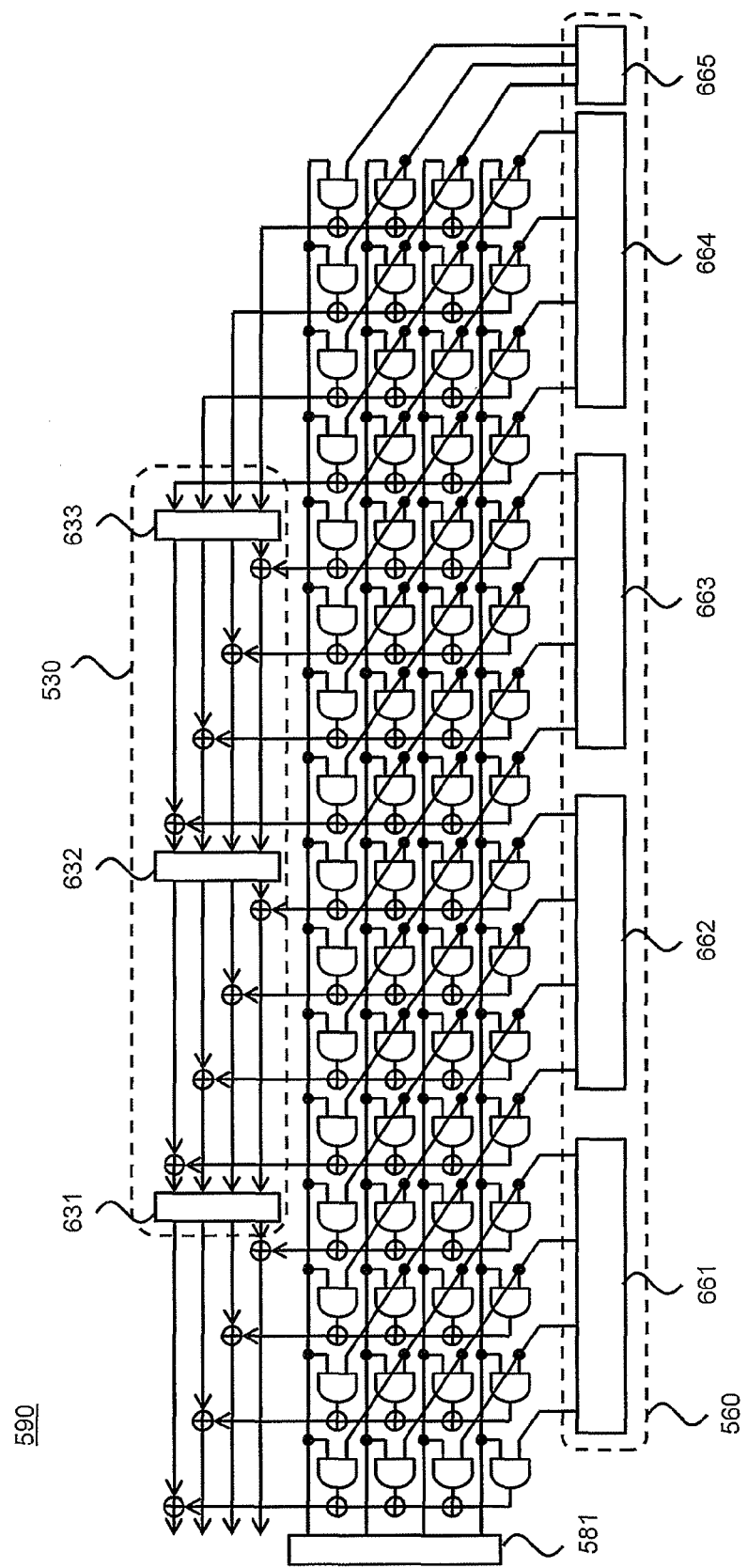
FIG. 6 shows an example of a combination circuit diagram for computing a partial product in the generator 500 of FIG. 5.

FIG. 6 shows an example of a combination circuit diagram for computing a partial product in the generator 500 of FIG. 5.

FIG. 6 shows an example of a detailed circuit diagram comprising the partial product computation circuit 590 and its peripheral registers (the intermediate value register 530, the generator polynomial reference register 560, and the quotient reference register 581) in FIG. 5.

The partial product computation circuit 590 shown in the drawing is a combination circuit systematically configured using AND gates and XOR gates. This circuit uses 19 (=4× 4+3) bits worth of the generator polynomial coefficients stored in the generator polynomial reference register 560, and utilizes four 16-bit rows (N×W bits×W rows), which deviate from the adjacent four rows by one bit. These four rows respectively correspond to four output values of the quotient reference register 581. Computations are then carried out for selecting, in accordance with AND gates, rows for which the corresponding output value of the quotient reference register 581 is 1, and convolving these rows column-wise for each bit using the XOR gates.

The generator polynomial reference register 560, as was explained hereinabove, comprises four 4-bit registers (in order from the higher-level term of the coefficient, i.e., 661, 662, 663, 664) and one 3-bit (665) register.

In the explanation of the parity code generation method according to this example, for example, there was a description of a partial division step that "subtracts a range related to r1 obtained using q1×g1 (302) and q1×g2 (303)", but the registers 661, 662, 663 and 664 are for referring to the g1 (4×4 bits) used in the computation q1×g1 (302), and the register 665 is for referring to a portion (higher-level three bits) of the g2, which is used in the computation q1×g2 (303). The generator polynomial reference register 560 is used in the same manner for the other partial division steps that were described.

The intermediate value register 530, as was explained hereinabove, comprises three 4-bit registers (631, 632, 633). The output of register 631 is achieved here by adding (XOR) a partial product result that depends on the values of the registers 661 and 662. The input of the register 631 is achieved by adding (XOR) a partial product result that depends on the values of the registers 662 and 663 to the output of the register 632. The input of the register 632 is achieved by adding (XOR) a partial product result that depends on the values of the registers 663 and 664 to the output of the register 633. The input of the register 633 is a partial product result that depends on the values of the registers 664 and 665.

Next, how a parity code is generated by the parity code generator 500 of FIG. 5 will be explained while referring to FIGS. 7 through 13.

The manner in which four types of data input/output (input of user data U, input of a generator polynomial G, and input/output of a remainder polynomial R) transition when the parity code generator 500 executes the method for computing the remainders (R4 and R8) explained using FIGS. 3 and 4 will be described by referring to FIG. 7.

Furthermore, the dividing of the respective 16-bit generator polynomial coefficient groups g1 through g3 into four sets of units of four bits will be described here. That is, it is supposed that:

g1={g11, g12, g13, g14}
g2={g21, g22, g23, g24}
g3={g31, g32, g33, g34}.

First, in the first through the 12$^{th}$ cycles (refer to FIG. 8 A through D and FIG. 9 A through D, which will be explained further below), 48 bits (710) of the generator polynomial G coefficients are read from the G(x) memory 520 in units of four bits and inputted in sequence to the parity code generator 500 for computing the remainder polynomial R4. In the fifth through the eighth cycles (refer to FIG. 8 A through D, which will be explained further below), the 16 bits (720) of u1 through u4 of the user data U are inputted four bits at a time in sequence to the parity code generator 500 for computing the remainder polynomial R4. In the 10$^{th}$ through the 21$^{st}$ cycles (refer to FIG. 8 A through D, FIG. 9 A through D, FIG. 10 A through D, FIG. 11 A through D, and FIG. 12 A through D, which will be explained further below), the 48 bits (730) of the coefficients r1 through r12 of the computed remainder polynomial R4 are outputted from the parity code generator 500 and written four bits at a time in sequence to the R(x) memory 510.

In addition, in the 13$^{th}$ through the 24$^{th}$ cycles (FIG. 10 A through D, FIG. 11 A through D, and FIG. 12 A through D), 48 bits (740) of the generator polynomial G coefficients are read four bits at a time from the G(x) memory 520 and inputted in sequence to the parity code generator 500 for computing the remainder polynomial R8. In the 17$^{th}$ through the 20$^{th}$ cycles (FIG. 11 A through D), the 16 bits (750) of u5 through u8 of the user data U are inputted four bits at a time in sequence to the parity code generator 500 for computing the remainder polynomial R8. In the 17$^{th}$ through the 28$^{th}$ cycles (FIG. 11 A through D, FIG. 12 A through D, and FIG. 13 A through D), the 48 bits (760) of the coefficients r1 through r12 of the just computed remainder polynomial R4 are read four bits at a time from the R(x) memory 510 and inputted in sequence to the parity code generator 500 for computing the remainder polynomial R8. In the 22$^{nd}$ through the 33$^{rd}$ cycles (FIG. 12 A through D, and FIG. 13 A through D), the 48 bits (770) of the coefficients r13 through r24 of the computed remainder polynomial R8 are outputted from the parity codegenerator 500 and written four bits at a time in sequence to the R(x) memory 510. Furthermore, the cycles up to the 28th cycle are shown in FIG. 7.

The parity code generator 500 computes the remainder polynomial R4 by referencing a portion of the user data U (u1, u2, u3, u4), which is to be inputted during the 12 cycles, and the coefficients of the generator polynomials G (g1, g2, g3), which are to be read from the G(x) memory 520. During the next 12 cycles, the parity code generator 500 computes the remainder polynomial R8 by referencing the subsequent portion of the user data U (u5, u6, u7, u8), and the coefficients of the generator polynomials G (g1, g2, g3), which are to be read from the G(x) memory 520.

That is, the parity code generator 500 computes a parity polynomial R by repeating the remainder computations in a 12-cycle period 12 times as described hereinabove. During this processing, the parity code generator 500 writes/reads the coefficients of the remainder polynomials (R4 and R8) computed in each of the 12 cycles to/from the R(x) memory 510 four bits at a time. The parity code generator 500 ultimately computes the coefficients of the parity polynomial R R48), and writes these coefficients to the R(x) memory 510.

Therefore, in the generator 500 (W=4, N=4), for example, in a case where the design parameters are m=8 and t=6 and the user data is 160 bits (k=160), the parity code generator 500 will repeat the computations of the 12 cycle period 10 times. That is, in this example, when the generator 500 is implemented by deciding the parameters (W, N), the coefficients of a parity polynomial corresponding to various design parameters and/or the length of the user data bit length can be computed by repeatedly carrying out the computations of the (N×D) cycle period (k/NW) times no matter what the design parameters m and t are, or how long the bit length k of the user data is.

The operation of the parity code generator 500 in the fifth through the 28$^{th}$ cycles of the data input/output transitions of FIG. 7 will be explained by referring to FIGS. 8 through 13. FIG. 8 A through D show internal state diagrams of the parity code generator 500 between the respective fifth and eighth cycles. FIG. 9 A through D show internal state diagrams of the parity code generator 500 between the respective ninth and 12$^{th}$ cycles. FIG. 10 A through D show internal state diagrams of the parity code generator 500 between the respective 13$^{th}$ and 16$^{th}$ cycles. FIG. 11 A through D show internal state diagrams of the parity code generator 500 between the respective 17$^{th}$ and 20$^{th}$ cycles. FIG. 12 A through D show internal state diagrams of the parity code generator 500 between the respective 21$^{st}$ and 24$^{th}$ cycles. FIG. 13 A through D show internal state diagrams of the parity code generator 500 between the respective 25$^{th}$ and 28$^{th}$ cycles. The parity code is computed by treating 12 cycles as one set (fifth through the 16$^{th}$ cycles, 17$^{th}$ through the 28$^{th}$ cycles, 29$^{th}$ through the 40$^{th}$ cycles, 41$^{st}$ through the 52$^{nd}$ cycles), and operating on multiple sets. Furthermore, in the first through the fourth cycles, g1 of the generator polynomials (g1, g2, g3) is inputted from the G(x) memory 520 to the parity code generator 500 for dividing the user polynomials u1, u2, u3.

Figure 8B:
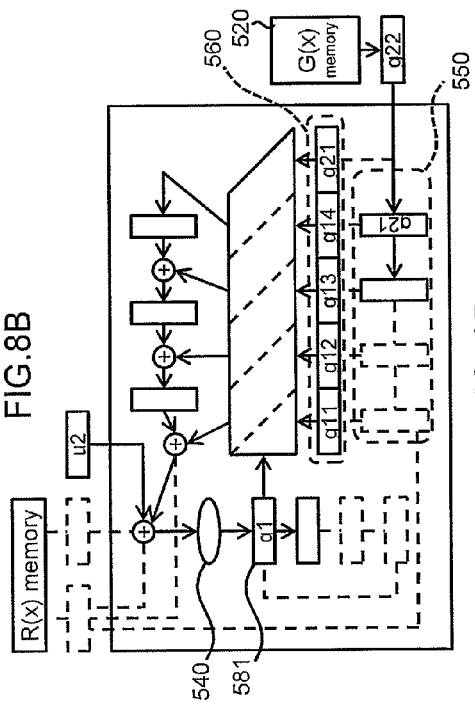
FIG. 8B shows an internal state diagram during the sixth cycle of FIG. 5.
Figure 8D:
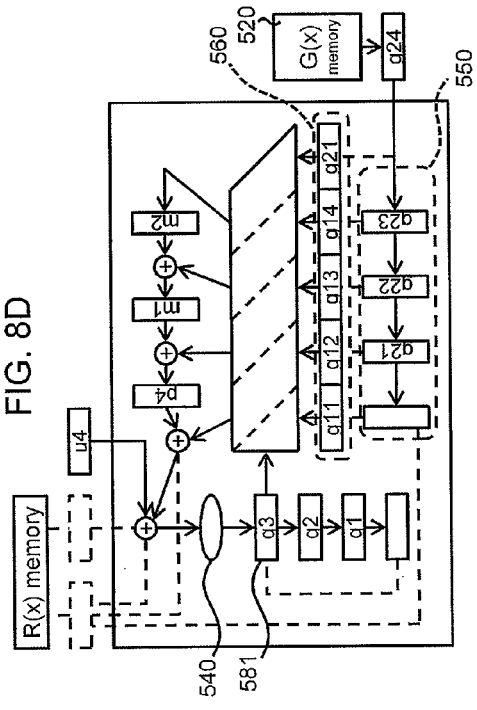
FIG. 8D shows an internal state diagram during the eighth cycle of FIG. 5.
Figure 8A:
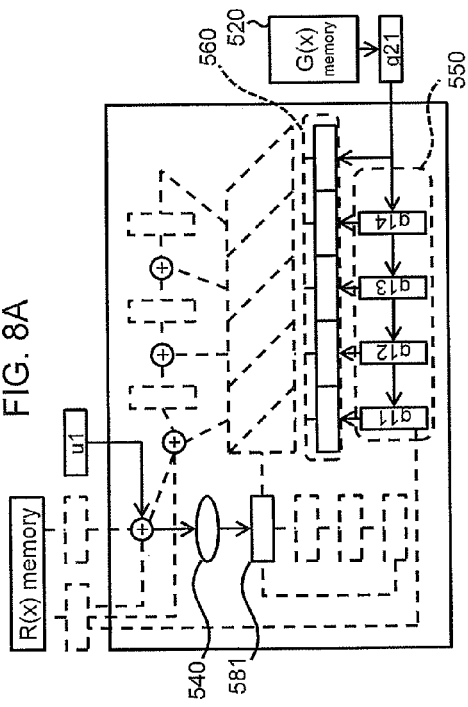
FIG. 8A shows an internal state diagram during the fifth cycle of FIG. 5.

In the fifth cycle, as shown in FIG. 8A, u1 of the user data is inputted to the quotient computation circuit 540 for determining the quotient q1. Meanwhile, the entire g1, which was read from the G(x) memory 520 in the first through the fourth cycles, is stored in the generator polynomial shift register 550, and preparations are made for inputting g21 from the G(x) memory 520.

In the sixth cycle, as shown in FIG. 8B, g1 is copied to the generator polynomial reference register 560 from the generator polynomial shift register 550, and g21 is simultaneously (substantially simultaneously) set from the G(x) memory 520. The computed quotient q1 is set in the quotient reference register 581. Furthermore, u2 of the user data and a range related to the quotient q2 obtained using a partial product q1×g1 are added together and inputted to the quotient computation circuit 540 for determining a quotient q2. Meanwhile, g21 is stored in the generator polynomial shift register 550, and preparations are made to input g22 from the G(x) memory 520.

Figure 8C:
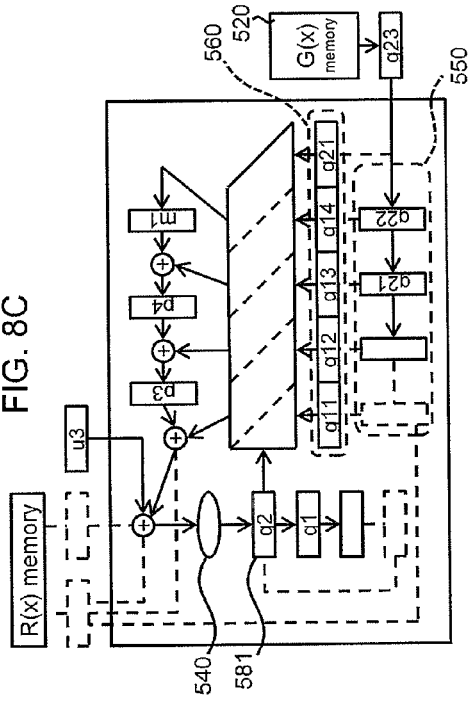
FIG. 8C shows an internal state diagram during the seventh cycle of FIG. 5.

In the seventh cycle, as shown in FIG. 8C, g1 and g21 remain in the generator polynomial reference register 560. The computed quotient q2 is set in the quotient reference register 581, and the quotient q1 is shifted downward. Furthermore, u3 of the user data, a range related to a quotient q3 obtained using a partial product q2×g1, and p3 of register 631 (refer to FIG. 6) are added together and inputted to the quotient computation circuit 540 for determining a quotient q3. Here, p3 is the range related to the quotient q3 obtained using the partial product q1×g1 computed in the sixth cycle. Meanwhile g21 and g22 are stored in the generator polynomial shift register 550, and preparations are made to input g23 from the G(x) memory 520.

In the eighth cycle, as shown in FIG. 8D, g1 and g21 remain in the generator polynomial reference register 560. The computed quotient q3 is set in the quotient reference register 581, and the quotients q1 and q2 are shifted downward. Furthermore, u4 of the user data, a range related to a quotient q4 obtained using a partial product q3×g1, and p4 of register 631 (refer to FIG. 6) are added together and inputted to the quotient computation circuit 540 for determining a quotient q4. Here, p4 is the sum of ranges related to the quotient q4 obtained using the partial products q1×g1 and q2×g1 computed in the sixth and seventh cycles. Meanwhile g21 through g23 are stored in the generator polynomial shift register 550, and preparations are made to input g24 from the G(x) memory 520.

Figure 9A:
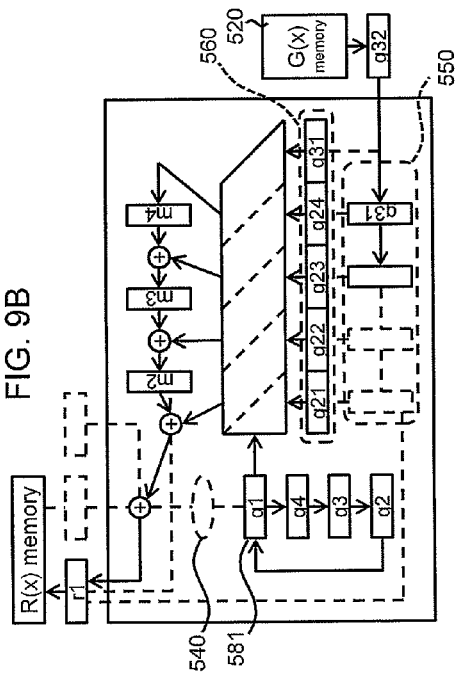
FIG. 9A shows an internal state diagram during the ninth cycle of FIG. 5.

In the ninth cycle, as shown in FIG. 9A, g1 and g21 remain in the generator polynomial reference register 560. The computed quotient q4 is set in the quotient reference register 581, and the quotients q1 through q3 are shifted downward. Furthermore, a range related to a partial remainder r1 obtained using a partial product q4×g1, and m1 of register 631 (refer to FIG. 6) are added together to determine the partial remainder r1. Here, m1 is the sum of ranges (391, 392, and 393 of FIG. 3) related to the partial remainder r1 obtained using the partial products computed in the sixth through the eighth cycles. Meanwhile g2 is stored in its entirety in the generator polynomial shift register 550, and preparations are made to input g31 from the G(x) memory 520.

Figure 9B:
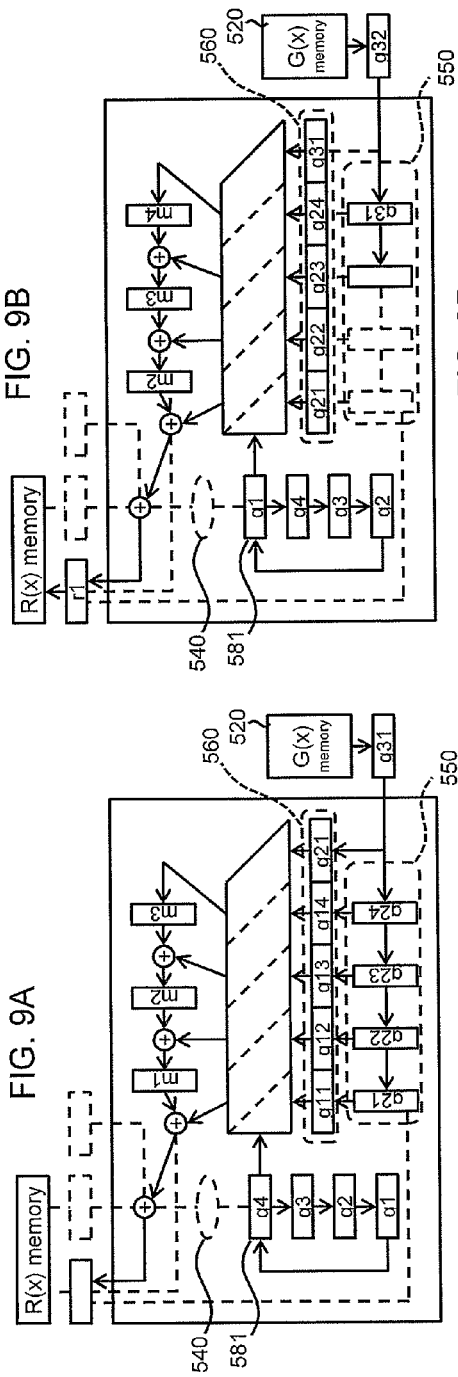
FIG. 9B shows an internal state diagram during the $10^{th}$ cycle of FIG. 5.

In the $10^{th}$ cycle, as shown in FIG. 9B, g2 is copied from the generator polynomial shift register 550 to the generator polynomial reference register 560, and g31 is also simultaneously (substantially simultaneously) set from the G(x) memory 520. The computed partial remainder r1 is outputted to the R(x) memory 510. The quotient q1 returns to the quotient reference register 581, and quotients q2 through q4 are shifted downward. Furthermore, a range related to a partial remainder r2 obtained using a partial product q1×g2, and m2 of register 631 are added together to determine the partial remainder r2. Here, m2 is the sum of ranges related to the partial remainder r2 obtained using the partial products computed in the seventh through the ninth cycles. Meanwhile g31 is stored in the generator polynomial shift register 550, and preparations are made to input g32 from the G(x) memory 520.

Figure 9C:
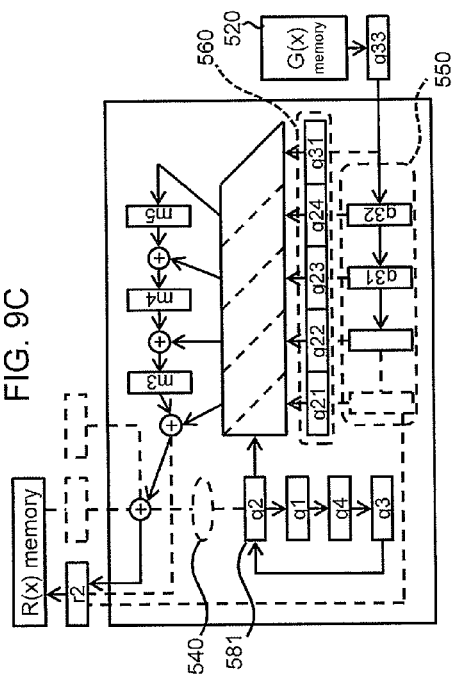
FIG. 9C shows an internal state diagram during the 11th cycle of FIG. 5.

In the $11^{th}$ cycle, as shown in FIG. 9C, g2 and g31 remain in the generator polynomial reference register 560. The computed partial remainder r2 is outputted to the R(x) memory 510. The quotient q2 returns to the quotient reference register 581, and quotients q3, q4 and q1 are shifted downward. Furthermore, a range related to a partial remainder r3 obtained using a partial product q2×g2, and m3 of register 631 (Refer to FIG. 6) are added together to determine the partial remainder r3. Here, m3 is the sum of ranges related to the partial remainder r3 obtained using the partial products computed in the eighth through the $10^{th}$ cycles. Meanwhile g31 and g32 are stored in the generator polynomial shift register 550, and preparations are made to input g33 from the G(x) memory 520.

Figure 9D:
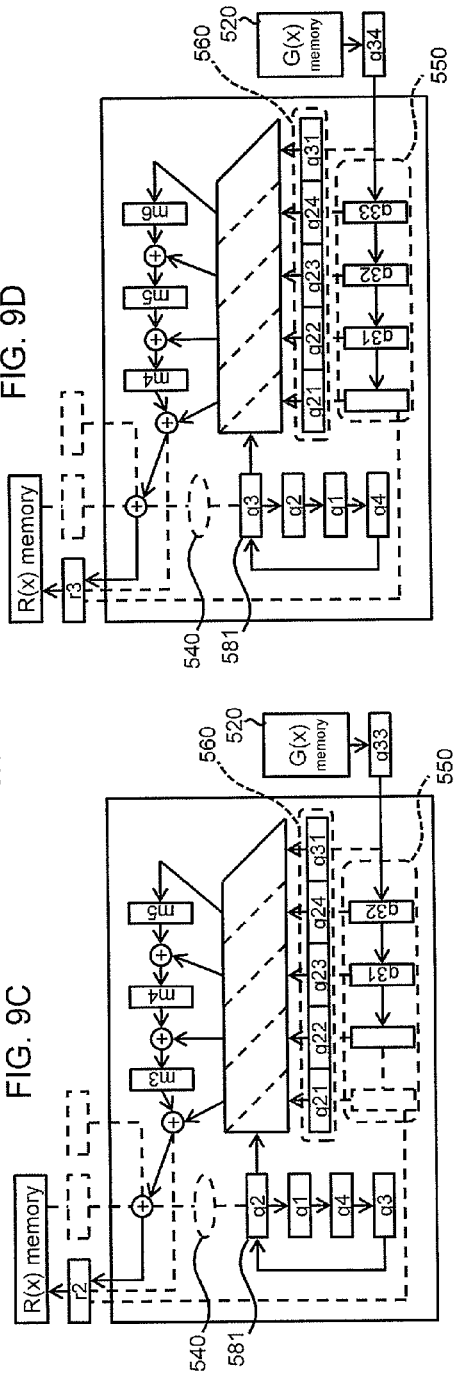
FIG. 9D shows an internal state diagram during the 12th cycle of FIG. 5.

In the $12^{th}$ cycle, as shown in FIG. 9D, g2 and g31 remain in the generator polynomial reference register 560. The computed partial remainder r3 is outputted to the R(x) memory 510. The quotient q3 returns to the quotient reference register 581, and quotients q4, q1 and q2 are shifted downward. Furthermore, a range related to a partial remainder r4 obtained using a partial product q3×g2, and m4 of register 631 (Refer to FIG. 6) are added together to determine the partial remainder r4. Here, m4 is the sum of ranges related to the partial remainder r4 obtained using the partial products computed in the ninth through the $11^{th}$ cycles. Meanwhile g31 through g33 are stored in the generator polynomial shift register 550, and preparations are made to input g34 from the G(x) memory 520.

In the $13^{th}$ cycle, as shown in FIG. 10A, g2 and g31 remain in the generator polynomial reference register 560. The computed partial remainder r4 is outputted to the R(x) memory 510. The quotient q4 returns to the quotient reference register 581, and quotients q1 through q3 are shifted downward. Furthermore, a range related to a partial remainder r5 obtained using a partial product q4×g2, and m5 of register 631 (Refer to FIG. 6) are added together to determine the partial remainder r5. Here, m5 is the sum of ranges related to the partial remainder r5 obtained using the partial products computed in the $10^{th}$ through the $12^{th}$ cycles. Meanwhile g3 is stored in its entirety in the generator polynomial shift register 550, and preparations are made to input g11 from the G(x) memory 520.

In the $14^{th}$ cycle, as shown in FIG. 10B, g3 is copied to the generator polynomial reference register 560. The computed partial remainder r5 is outputted to the R(x) memory 510. The quotient q1 returns to the quotient reference register 581, and quotients q2 through q4 are shifted downward. Furthermore, a range related to a partial remainder r6 obtained using a partial product q1×g3, and m6 of register 631 are added together to determine the partial remainder r6. Here, m6 is the sum of ranges related to the partial remainder r6 obtained using the partial products computed in the $11^{th}$ through the $13^{th}$ cycles. Meanwhile g11 is stored in the generator polynomial shift register 550, and preparations are made to input g12 from the G(x) memory 520.

In the $15^{th}$ cycle, as shown in FIG. 10C, g3 remains in the generator polynomial reference register 560. The computed partial remainder r6 is outputted to the R(x) memory 510. The quotient q2 returns to the quotient reference register 581, and quotients q3, q4, and q1 are shifted downward. Furthermore, a range related to a partial remainder r7 obtained using a partial product q2×g3, and m7 of register 631 are added together to determine the partial remainder r7. Here, m7 is the sum of ranges related to the partial remainder r7 obtained using the partial products computed in the $12^{th}$ through the $14^{th}$ cycles. Meanwhile g11 and g12 are stored in the generator polynomial shift register 550, and preparations are made to input g13 from the G(x) memory 520.

In the $16^{th}$ cycle, as shown in FIG. 10D, g3 remains in the generator polynomial reference register 560. The computed partial remainder r7 is outputted to the R(x) memory 510. The quotient q3 returns to the quotient reference register 581, and quotients q4, q1, and q2 are shifted downward. Furthermore, a range related to a partial remainder r8 obtained using a partial product q3×g3, and m8 of register 631 are added together to determine the partial remainder r8. Here, m8 is the sum of ranges related to the partial remainder r8 obtained using the partial products computed in the $13^{th}$ through the $15^{th}$ cycles. Meanwhile, g11 through g13 are stored in the generator polynomial shift register 550, and preparations are made to input g14 from the G(x) memory 520.

The fifth through the $16^{th}$ cycles are computations related to the user data u1, u2, u3, and u4, and this constitutes one set. From the $17^{th}$ cycle onward, the computations are related to u5, u6, u7, and u8, and the $17^{th}$ cycle onward constitutes the next set.

Figure 11B:
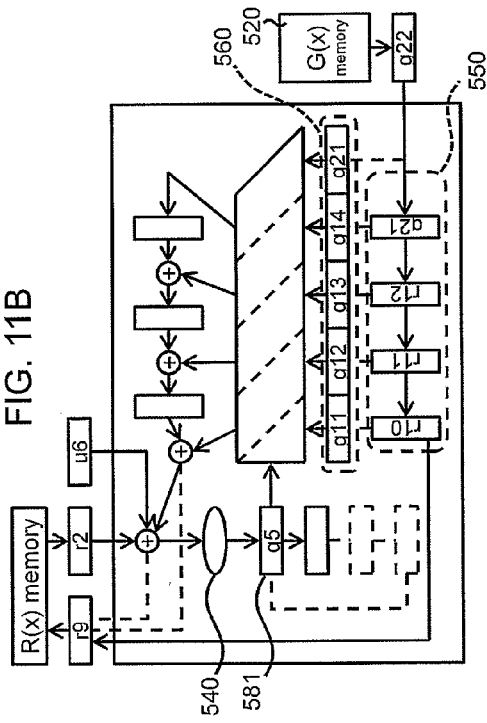
FIG. 11B shows an internal state diagram during the 18th cycle of FIG. 5.
Figure 11A:
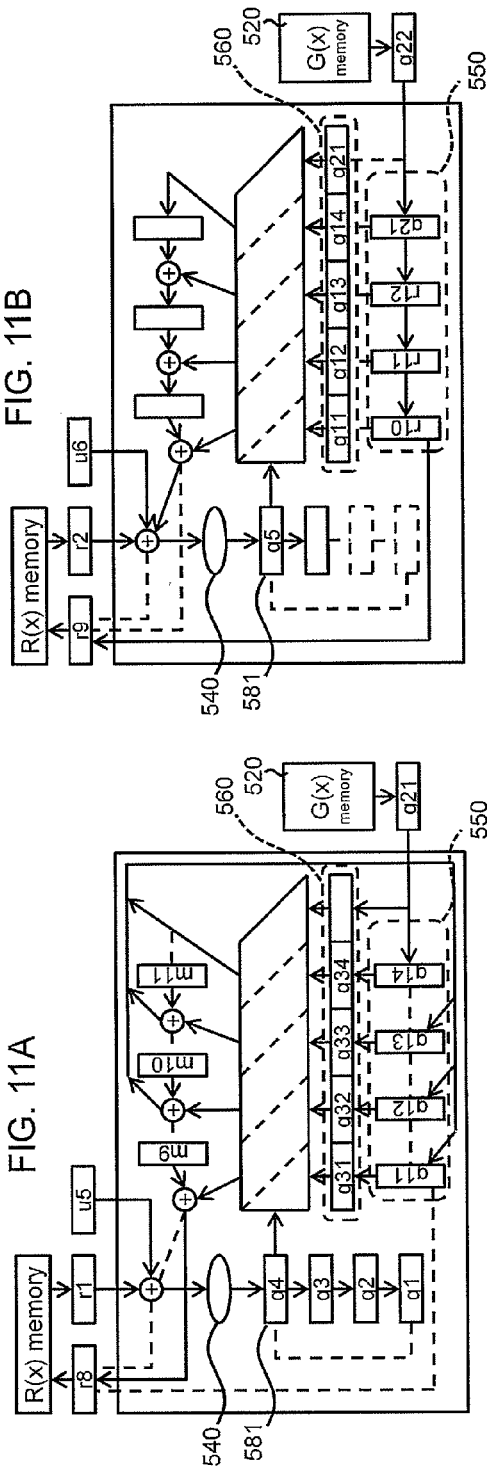
FIG. 11A shows an internal state diagram during the 17th cycle of FIG. 5.

Specifically, in the $17^{th}$ cycle, as shown in FIG. 11A, g3 remains in the generator polynomial reference register 560. The computed partial remainder r8 is outputted to the R(x) memory 510. The quotient q4 returns to the quotient reference register 581, and quotients q1 through q3 are shifted downward. Furthermore, a range related to a partial remainder r9 obtained using a partial product q4×g3, and m9 of register 631 are added together to determine the partial remainder r9. Here, m9 is the sum of ranges related to the partial remainder r9 obtained using the partial products computed in the $14^{th}$ through the $16^{th}$ cycles. Furthermore, a range related to a partial remainder r10 in accordance with the partial product q4×g3, and m10 of register 632 (refer to FIG. 6) are added together to determine the partial remainder r10. Here, m10 is the sum of ranges related to the partial remainder r10 obtained using the partial products computed in the $15^{th}$ through the $16^{th}$ cycles. Furthermore, a range related to a partial remainder r11 obtained using the partial product q4×g3, and m11 of register 633 (refer to FIG. 6) are added together to determine the partial remainder r11. Here, m11 is the sum of ranges related to the partial remainder r11 obtained using the partial products computed in the $16^{th}$ cycle. Furthermore, a range related to a partial remainder r12 obtained using the partial product q4×g3 is prepared for determining the partial remainder r12. In addition, partial remainder r1, which is read from the R(x) memory 510, and u5 of the user data are added together, and inputted to the quotient reference circuit 540 for determining quotient q5. Meanwhile g1 is stored in its entirety in the generator polynomial shift register 550, and preparations are made to input g21 from the G(x) memory 520.

In the $18^{th}$ cycle, as shown in FIG. 11B, g1 is copied from the generator polynomial shift register 550 to the generator polynomial reference register 560, and g21 is simultaneously (substantially simultaneously) set from the G(x) memory 520. The computed partial remainder r9 is outputted to the R(x) memory 510, and the computed partial remainders r10, r11, and r12 are stored in a free portion of the generator polynomial shift register 550 by way of the special input data bus 591. Furthermore, the computed quotient q5 is set in the quotient reference register 581. In addition, partial remainder r2, which has been read from the R(x) memory 510, u6 of the user data, and a range related to a quotient q6 obtained using a partial product q5×g1 are added together, and inputted to the quotient reference circuit 540 for determining quotient q6. Meanwhile, g21 is stored in the generator polynomial shift register 550, and preparations are made to input g22 from the G(x) memory 520.

Figure 11D:
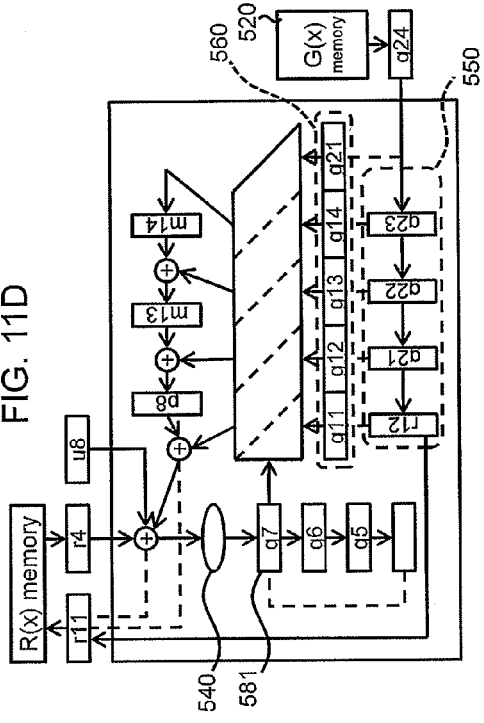
FIG. 11D shows an internal state diagram during the 20th cycle of FIG. 5.
Figure 11C:
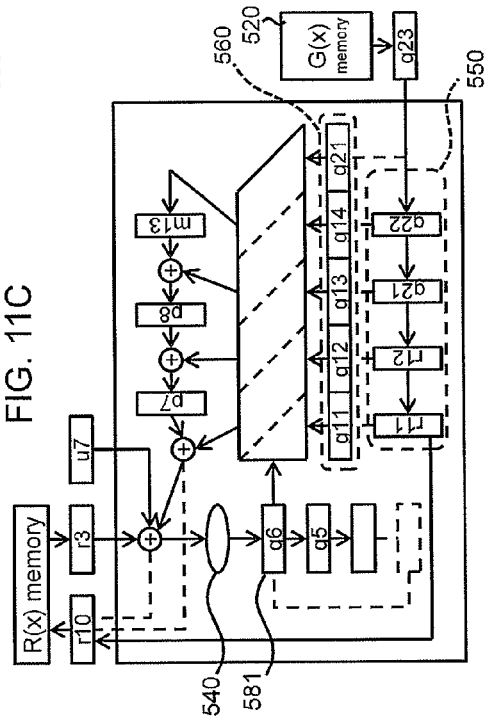
FIG. 11C shows an internal state diagram during the 19th cycle of FIG. 5.

In the $19^{th}$ cycle, as shown in FIG. 11C, g1 and g21 remain in the generator polynomial reference register 560. The stored partial remainder r10 is outputted to the R(x) memory 510, and r11 and r12 are shifted to the left. The computed quotient q6 is set in the quotient reference register 581, and quotient q5 is shifted downward. Furthermore, partial remainder r3, which has been read from the R(x) memory 510, u7 of the user data, a range related to a quotient q7 obtained using a partial product q6×g1, and p7 of register 631 (refer to FIG. 6) are added together, and inputted to the quotient reference circuit 540 for determining quotient q7. Here, p7 is the range related to the quotient q7 in accordance with the partial product q5×g1 computed in the $18^{th}$ cycle. Meanwhile, g21 and g22 are stored in the generator polynomial shift register 550, and preparations are made to input g23 from the G(x) memory 520.

In the $20^{th}$ cycle, as shown in FIG. 11D, g1 and g21 remain in the generator polynomial reference register 560. The stored partial remainder r11 is outputted to the R(x) memory 510, and r12 is shifted to the left. The computed quotient q7 is set in the quotient reference register 581, and quotients q5 and q6 are shifted downward. Furthermore, partial remainder r4, which has been read from the R(x) memory 510, u8 of the user data, a range related to a quotient q8 obtained using a partial product q7×g1, and p8 of register 631 are added together, and inputted to the quotient reference circuit 540 for determining quotient q8. Here, p8 is the sum of ranges related to the quotient q8 obtained using the partial products computed in the $18^{th}$ and $19^{th}$ cycles. Meanwhile, g21 through g23 are stored in the generator polynomial shift register 550, and preparations are made to input g24 from the G(x) memory 520.

Figure 12A:
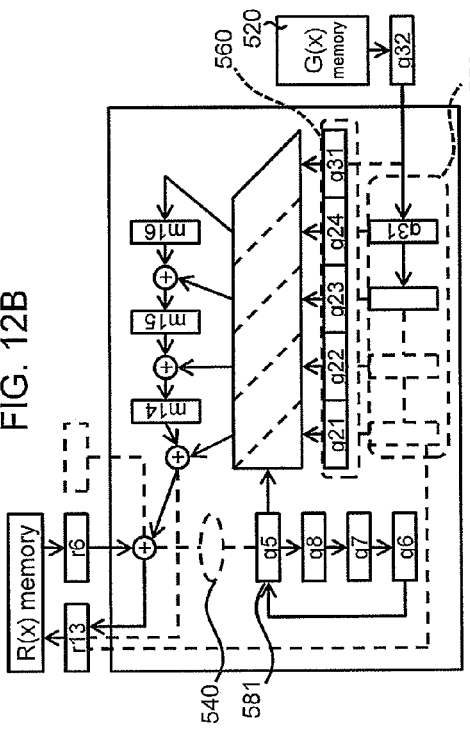
FIG. 12A shows an internal state diagram during the 21st cycle of FIG. 5.

In the $21^{st}$ cycle, as shown in FIG. 12A, g1 and g21 remain in the generator polynomial reference register 560. The stored partial remainder r12 is outputted to the R(x) memory 510. The computed quotient q8 is set in the quotient reference register 581, and quotients q5 through q7 are shifted downward. Furthermore, partial remainder r5, which has been read from the R(x) memory 510, a range related to a partial remainder r13 obtained using a partial product q8×g1, and m13 of register 631 are added together for determining the partial remainder r13. Here, m13 is the sum of ranges related to the partial remainder r13 obtained using the partial products computed in the $18^{th}$ through the $20^{th}$ cycles. Meanwhile, g2 is stored in its entirety in the generator polynomial shift register 550, and preparations are made to input g31 from the G(x) memory 520.

Figure 12B:
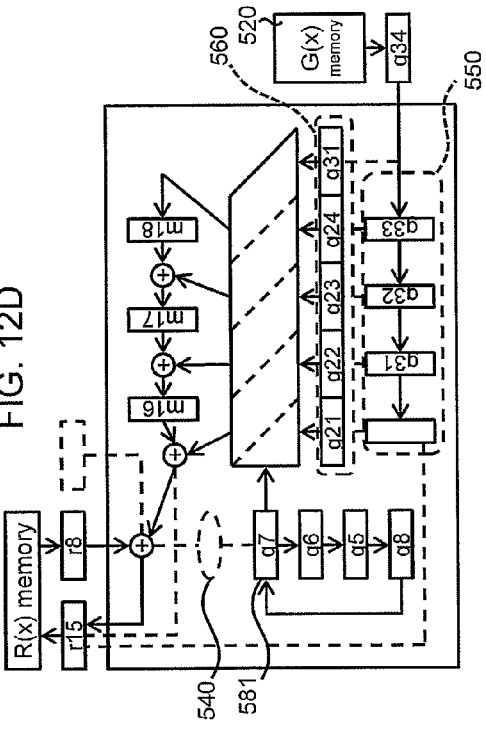
FIG. 12B shows an internal state diagram during the 22nd cycle of FIG. 5.

In the $22^{nd}$ cycle, as shown in FIG. 12B, g2 is copied from the generator polynomial shift register 550 to the generator polynomial reference register 560, and g31 is simultaneously (substantially simultaneously) set from the G(x) memory 520. The computed partial remainder r13 is outputted to the R(x) memory 510. The quotient q5 returns to the quotient reference register 581, and quotients q6 through q8 are shifted downward. Furthermore, partial remainder r6, which has been read from the R(x) memory 510, a range related to a partial remainder r14 obtained using a partial product q5×g2, and m14 of the register 631 are added together for determining the partial remainder r14. Here, m14 is the sum of ranges related to the partial remainder r14 obtained using the partial products computed in the $19^{th}$ through the $21^{st}$ cycles. Meanwhile, g31 is stored in the generator polynomial shift register 550, and preparations are made to input g32 from the G(x) memory 520.

Figure 12C:
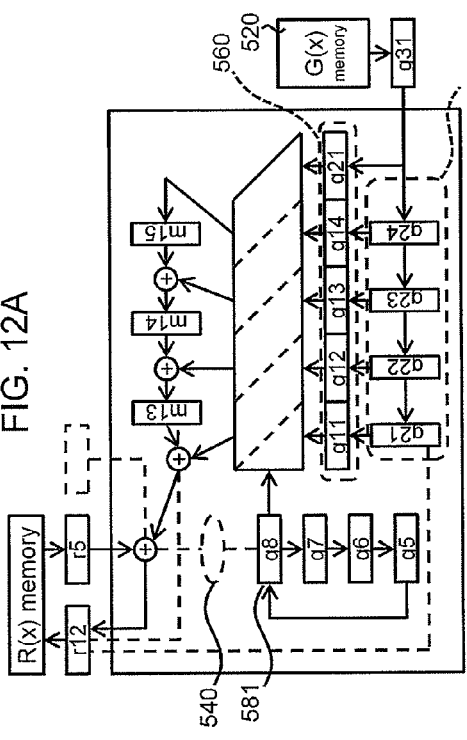
FIG. 12C shows an internal state diagram during the 23rd cycle of FIG. 5.

In the $23^{rd}$ cycle, as shown in FIG. 12C, g2 and g31 remain in the generator polynomial reference register 560. The computed partial remainder r14 is outputted to the R(x) memory 510. The quotient q6 returns to the quotient reference register 581, and quotients q7, q8, and q5 are shifted downward. Furthermore, partial remainder r7, which has been read from the R(x) memory 510, a range related to a partial remainder r15 obtained using a partial product q6×g2, and m15 of register 631 are added together for determining the partial remainder r15. Here, m15 is the sum of ranges related to the partial remainder r15 obtained using the partial products computed in the $20^{th}$ through the $22^{nd}$ cycles. Meanwhile g31 and g32 are stored in the generator polynomial shift register 550, and preparations are made to input g33 from the G(x) memory 520.

Figure 12D:
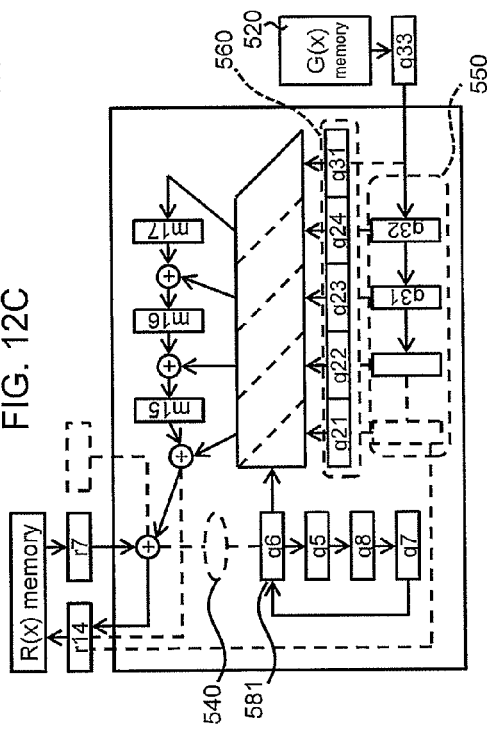
FIG. 12D shows an internal state diagram during the $24^{th}$ cycle of FIG. 5.

In the $24^{th}$ cycle, as shown in FIG. 12D, g2 and g31 remain in the generator polynomial reference register 560. The computed partial remainder r15 is outputted to the R(x) memory 510. The quotient q7 returns to the quotient reference register 581, and quotients q8, q5, and q6 are shifted downward. Furthermore, partial remainder r8, which has been read from the R(x) memory 510, a range related to a partial remainder r16 obtained using a partial product q7×g2, and m16 of register 631 are added together for determining the partial remainder r16. Here, m16 is the sum of ranges related to the partial remainder r16 obtained using the partial products computed in the $21^{st}$ through the $23^{rd}$ cycles. Meanwhile, g31 through g33 are stored in the generator polynomial shift register 550, and preparations are made to input g34 from the G(x) memory 520.

Figure 13A:
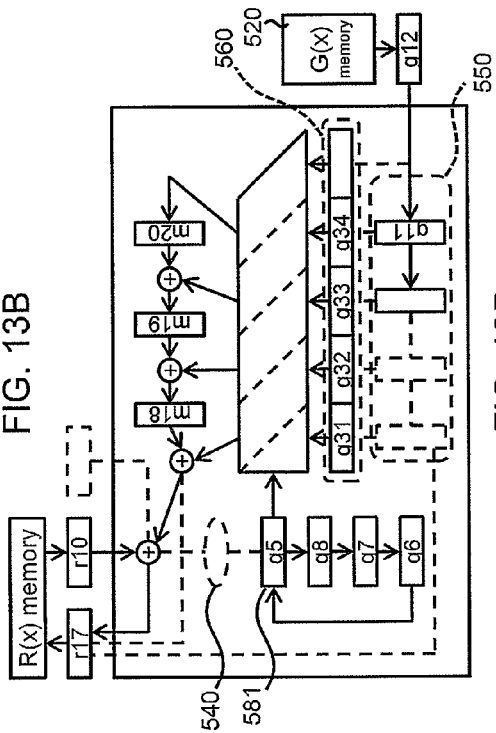
FIG. 13A shows an internal state diagram during the $25^{th}$ cycle of FIG. 5.

In the 25$^{th}$ cycle, as shown in FIG. 13A, g2 and g31 remain in the generator polynomial reference register 560. The computed partial remainder r16 is outputted to the R(x) memory 510. The quotient q8 returns to the quotient reference register 581, and quotients q5 through q7 are shifted downward. Furthermore, partial remainder r9, which has been read from the R(x) memory 510, a range related to a partial remainder r17 obtained using a partial product q8×g2, and m17 of register 631 are added together for determining the partial remainder r17. Here, m17 is the sum of ranges related to the partial remainder r17 in obtained using the partial products computed in the 22$^{nd}$ through the 24$^{th}$ cycles. Meanwhile, g3 is stored in its entirety in the generator polynomial shift register 550, and preparations are made to input g11 from the G(x) memory 520.

Figure 13C:
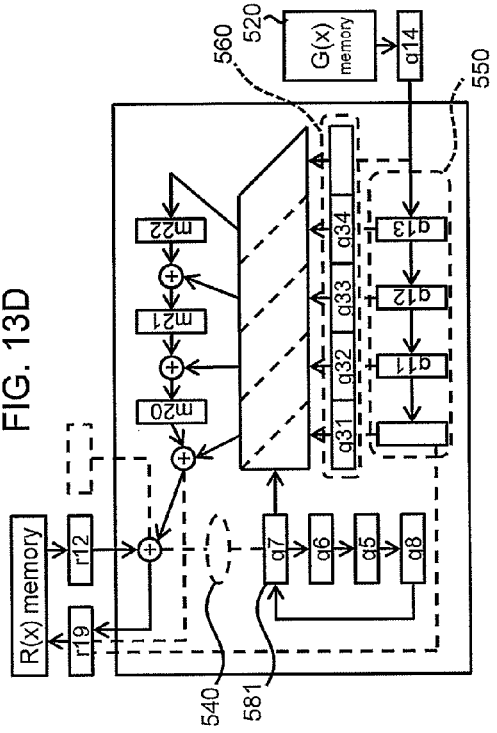
FIG. 13C shows an internal state diagram during the 27$^{th}$ cycle of FIG. 5.
Figure 13B:
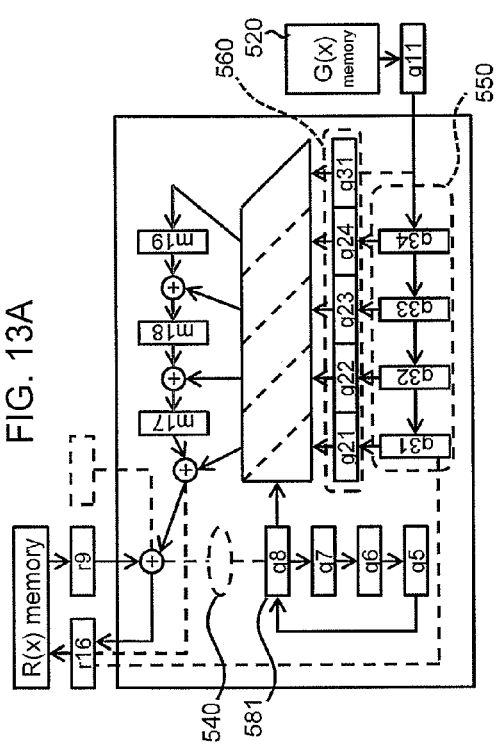
FIG. 13B shows an internal state diagram during the $26^{th}$ cycle of FIG. 5.

In the 26$^{th}$ cycle, as shown in FIG. 13B, g3 is copied from the generator polynomial shift register 550 to the generator polynomial reference register 560. The computed partial remainder r17 is outputted to the R(x) memory 510. The quotient q5 returns to the quotient reference register 581, and quotients q6 through q8 are shifted downward. Furthermore, partial remainder r10, which has been read from the R(x) memory 510, a range related to a partial remainder r18 obtained using a partial product q5×g3, and m18 of register 631 are added together for determining the partial remainder r18. Here, m18 is the sum of ranges related to the partial remainder r18 obtained using the partial products computed in the 23$^{rd}$ through the 25$^{th}$ cycles. Meanwhile, g11 is stored in the generator polynomial shift register 550, and preparations are made to input g12 from the G(x) memory 520.

In the 27$^{th}$ cycle, as shown in FIG. 13C, g3 remains in the generator polynomial reference register 560. The computed partial remainder r18 is outputted to the R(x) memory 510. The quotient q6 returns to the quotient reference register 581, and quotients q7, q8, and q5 are shifted downward. Furthermore, partial remainder r11, which has been read from the R(x) memory 510, a range related to a partial remainder r19 obtained using a partial product q6×g3, and m19 of register 631 are added together for determining the partial remainder r19. Here, m19 is the sum of ranges related to the partial remainder r19 obtained using the partial products computed in the 24$^{th}$ through the 26$^{th}$ cycles. Meanwhile, g11 and g12 are stored in the generator polynomial shift register 550, and preparations are made to input g13 from the G(x) memory 520.

Figure 13D:
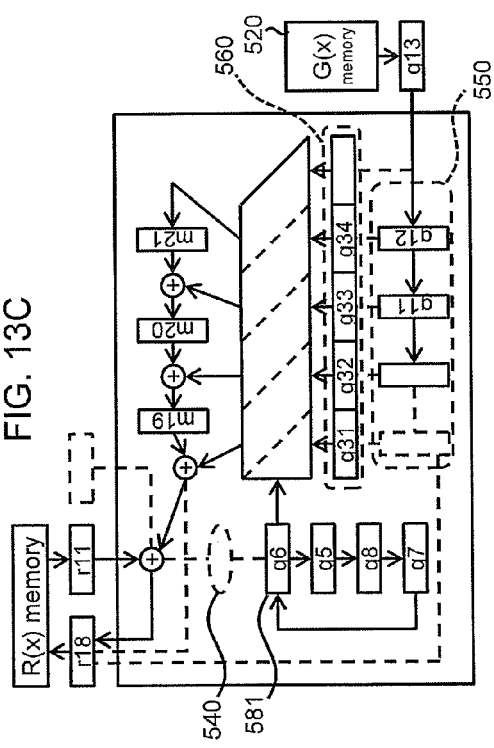
FIG. 13D shows an internal state diagram during the 28$^{th}$ cycle of FIG. 5.

In the 28$^{th}$ cycle, as shown in FIG. 13D, g3 remains in the generator polynomial reference register 560. The computed partial remainder r19 is outputted to the R(x) memory 510. The quotient q7 returns to the quotient reference register 581, and quotients q8, q5, and q6 are shifted downward. Furthermore, partial remainder r12, which has been read from the R(x) memory 510, a range related to a partial remainder r20 obtained using a partial product q7×g3, and m20 of register 631 are added together for determining the partial remainder r20. Here, m20 is the sum of ranges related to the partial remainder r20 obtained using the partial products computed in the 25$^{th}$ through the 27$^{th}$ cycles. Meanwhile, g11 through g13 are stored in the generator polynomial shift register 550, and preparations are made to input g14 from the G(x) memory 520.

The FM controller 100, which comprises the parity code generator 500 of this example, is equipped with RAM, which corresponds to the G(x) memory 520 and the R(x) memory 510, and computes the parity code by inputting/outputting the coefficients of the generator polynomial G and the coefficients of the remainder polynomial R to/from these memories and the parity code generator 500.

Now then, in the above explanation, the capacities of the G(x) memory 520 and the R(x) memory 510 were 48 (=m× t=8×6) bits, respectively. In the following explanation, a case in which another memory (for example, an external RAM) is used to supplement the capacity of the two memories will be considered. In so doing, it is possible to make it appear to the parity code generator 500 that the capacity of the internal RAM is larger than 48 bits. This signifies that, while the capacity of the parity code generator 500 remains the same as initially designed, the parity code generator 500 capacity, that is, the value of (m×t) has been extended. Therefore, a parity code can be generated for a flash memory that requires a larger number of error-correctable bits (t) than was assumed at the design stage.

A method for extending the number of error-correctable bits in an FM controller 1400 comprising the parity code generator 500 according to this example will be explained by referring to FIG. 14.

Figure 14:
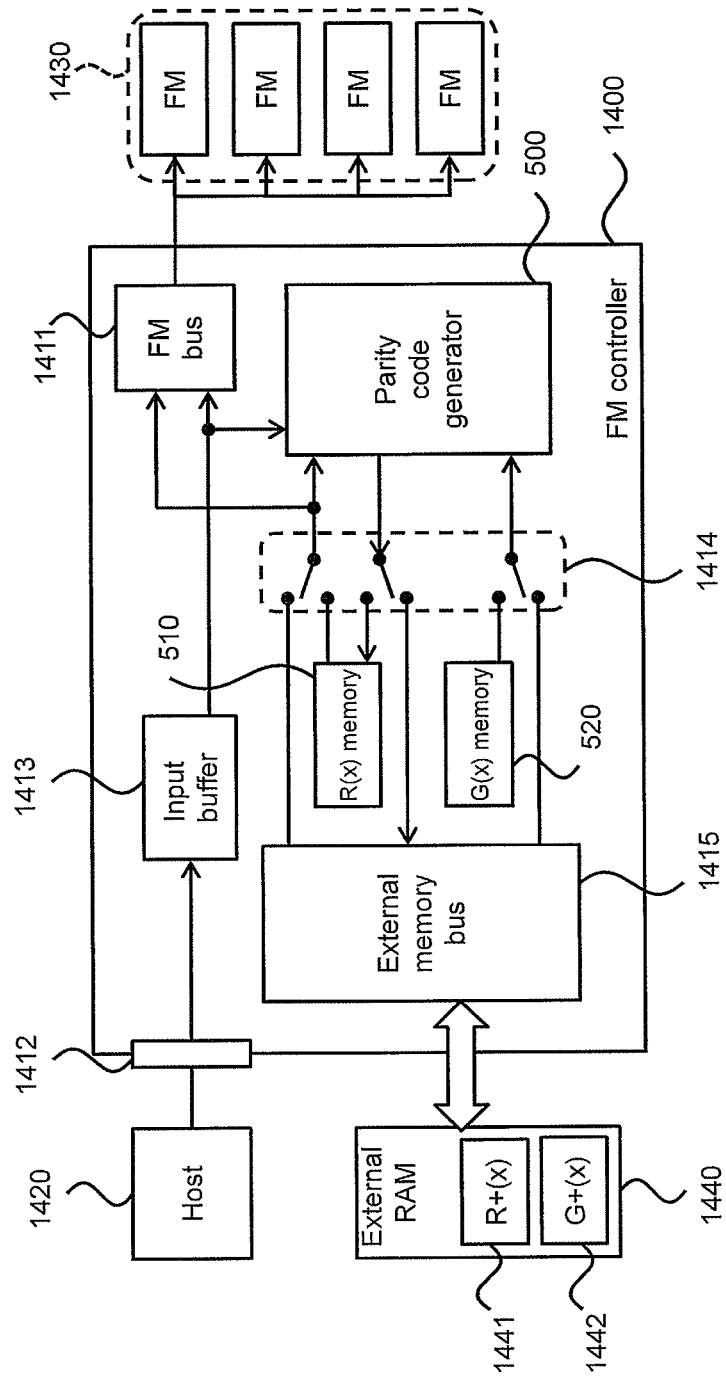
FIG. 14 shows an example of a block diagram of a system, which comprises an electronic device comprising an FM controller 1400.

FIG. 14 shows an example of a block diagram of a system comprising an electronic device, which comprises the FM controller 1400.

This electronic device is a variation of the electronic device shown in FIG. 1. The FM controller 1400 is a semiconductor chip comprising a microprocessor for controlling flash memory in accordance with an embedded program, and peripheral logic circuits, the same as the FM controller 100 of FIG. 1.

The peripheral logic circuits include the parity code generator 500 shown in FIG. 5, a FM bus 1411, a host interface 1412, an input buffer 1413, a memory path switch 1414, and an external memory bus 1415. In addition, the internal RAM-configured R(x) memory 510 and the G(x) memory 520 shown in FIG. 5 are also included. The FM controller 1400 is coupled to an external host 1420 via the host interface 1412, and is coupled to one or more external FMs 1430 via the FM bus 1411.

The FM bus 1411, the host interface 1412, and the input buffer 1413 are the same as the FM bus 114, the host interface 112, and the input buffer 113 of FIG. 1, and as such, explanations will be omitted.

The FM controller 1400 is coupled via the external memory bus 1415 to an external RAM 1440 (for example, a DRAM), which is outside of the FM controller 1400. The external RAM 1440 may be inside or outside of the FM package that comprises the FM controller 1400.

The external RAM 1440 may be a SRAM (Static RAM) or the like as long as the memory is capable of reading and writing data randomly.

The external RAM 1440 comprises an area for storing a portion of the coefficients of the remainder polynomial R: a $R_+(x)$ area 1441, and an area for storing a portion of the coefficients of the generator polynomial G: a $G_+(x)$ area 1442.

The memory path switch 1414 selects either the R(x) memory 510 or the $R_+(x)$ area 1441 as the supply destination of the coefficients of the remainder polynomial R outputted from the parity code generator 500 and/or the supply source of the coefficients of the remainder polynomial R inputted to the parity code generator 500. In addition, the memory path switch 1414 selects either the G(x) memory 520 or the $G_+(x)$ area 1442 as the supply source of the coefficients of the generator polynomial G inputted to the parity code generator 500.

During an operation in which the number of error-correctable bits t is not extended, the memory path switch 1414 is fixed in the state that selects the R(x) memory 510 and the G(x) memory 520 at all times. However, during an operation in which the number of error-correctable bits t is extended, the memory path switch 1414 switches over to select the $R_+(x)$ area 1441 or the $G_+(x)$ area 1442 at a decided time.

The selection switching method of the memory path switch 1414 at the time of an operation in which the number of error-correctable bits t is extended will be described by referring to FIG. 15. Here, a case in which the number of error-correctable bits t is extended from the six bits used in the explanation up to this point to eight bits, that is, by two bits, will be considered.

Figure 15:
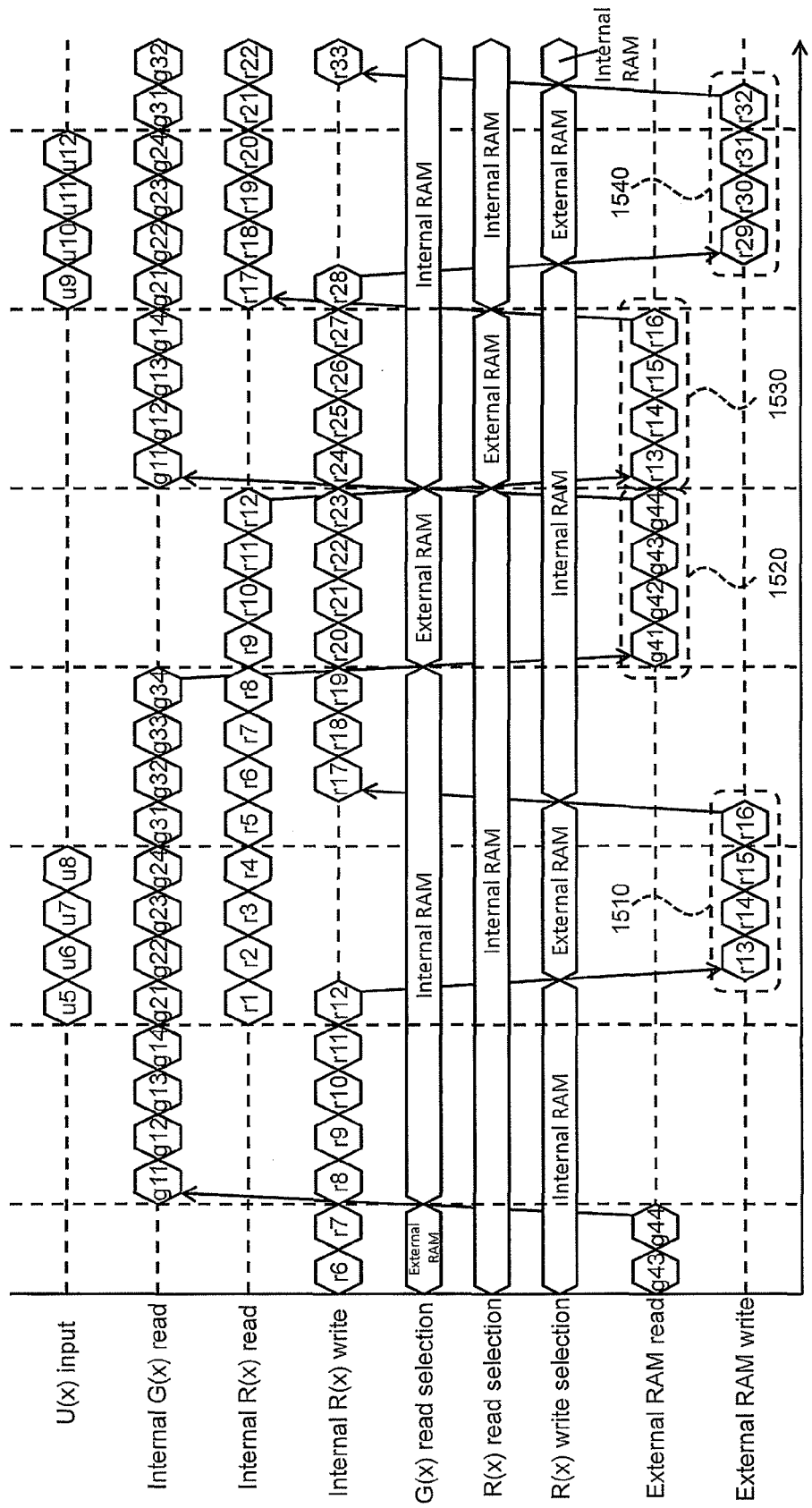
FIG. 15 shows an example of a transition diagram of input/output memory data and memory selection signals in the FM controller 1400 of FIG. 14.

FIG. 15 shows an example of a transition diagram of input/output memory data and memory selection signals in the FM controller 1400 of FIG. 14.

In accordance with this extension, the length of the parity code becomes m×(t+dt)=8×(6×2)=64 bits. For this reason, the coefficients of the generator polynomial G constitute a degree of 64, and a 64-bit memory is required for storing the coefficients, exclusive of the coefficient $G_{64}=1$ of highest-order term $x^{64}$ the same as before. Since the capacity of the G(x) memory 520 of up to now is 48 bits, the remaining 16 bits is supplemented by the $G_+(x)$ area 1442 of the external RAM 1440. Furthermore, the degree of the remainder polynomial R is a degree of 63, and a 64-bit memory is required for storing the coefficients. Since the capacity of the R(x) memory 510 of up to now is 48 bits, the remaining 16 bits is supplemented by the $R_+(x)$ area 1441 of the external RAM 1440.

According to the parity code generation method of this example, the remainder computations are grouped together in four-step segments the same as was explained using FIGS. 3 and 4, and 64-bit remainders R4 and R8 are computed. The result of dividing the coefficients of the remainders R4 and R8 into sets of 16 in units of four bits from the respective leftmost coefficients is expressed as {r1, r2, r3 . . . , r14, r15, r16} and {r17, r18, r19 . . . , r30, r31, r32}.

Furthermore, the 64 bits of the generator polynomial G coefficients (exclusive of the coefficient $G_{64}=1$ of $x^{64}$) are divided into 16-bit coefficient groups g1 through g4, and are depicted as being divided into four sets of 4-bit units each. That is, these four sets are:

g1={g11, g12, g13, g14}
g2={g21, g22, g23, g24}
g3={g31, g32, g33, g34}
g4={g41, g42, g43, g44}.

The 16 bits of g4 from thereamong are stored in the $G_+(x)$ area 1442 beforehand.

FIG. 15 shows how the four types of data input/output (input of user data U, input of a generator polynomial G, and input/output of a remainder polynomial R) of the parity code generator 500, the state of the memory path switch 1414, and the data input/output of the external RAM 1440 transition around the time when the remainders R4 and R8 are computed.

The dotted-line box 1510 of FIG. 15 shows how the {r13, r14, r15, r16}, which are not in the R(x) memory 510, are written to the $R_+(x)$ area 1441 from among the computed remainder R4 in accordance with the memory path switch 1414 selecting the external RAM 1440 as the R(x) write destination.

The dotted-line box 1520 of FIG. 15 shows how the generator polynomial coefficient group g4, which does not reside in the G(x) memory 520, is read from the $G_+(x)$ area 1442 in accordance with the memory path switch 1414 selecting the external RAM 1440 as the G(x) read source.

The dotted-line box 1530 of FIG. 15 shows how the {r13, r14, r15, r16}, which do not reside in the R(x) memory 510, are read from among the remainder R4 from the $R_+(x)$ area 1441 by the memory path switch 1414 selecting the external RAM 1440 as the R(x) read source.

The dotted-line box 1540 of FIG. 15 shows how the {r29, r30, r31, r32}, which are not in the R(x) memory 510, are written to the $R_+(x)$ area 1441 from among the computed remainder R8 by the memory path switch 1414 selecting the external RAM 1440 as the R(x) write destination.

In the segments 1510 through 1540 hereinabove, it is preferable that the four selected segments of the external RAM 1440 not overlap with one another. This will make it possible for the external memory bus 1415 for accessing the external RAM 1440 to be configured using a single port having few signal lines, thereby enabling the cost of the FM package to be reduced. The FM package comprises the FM controller 1400, and one or more FMs 1430 coupled to the FM controller 1400.

Furthermore, in a case in which segments where external RAM 1440 accesses overlap are created at timing design, for example, a method for eliminating overlap by adjusting the external RAM 1440-supplemented portions in the generator polynomial G and remainder polynomial R coefficients is preferable as a method for avoiding selection segment overlap in the external RAM 1440.

Using FIG. 15 as an example, in a case where the design is such that the external $G_+(x)$ area 1442 (refer to FIG. 14) stores the g3, the segment of 1520 will be located four cycles earlier or later than the state shown in FIG. 15. For this reason, the segment of 1510 will overlap the access timing by one cycle. The one cycle overlap can be eliminated by making adjustments so that g4 is stored in the external $G_+(x)$ area 1442.

As described hereinabove, the FM controller 1400, which comprises the parity code generator 500 and the memory path switch 1414 shown in FIG. 14, can extend the number of error-correctable bits t to the extent permitted by this supplemental capacity dM by allocating an area for supplementing the coefficients of the generator polynomial G and remainder polynomial R in the external RAM 1440, which is coupled externally thereto. This is provided that an extension amount dt, which satisfies the condition of the following equation, can be selected:

$$dM1 >= m \times (t+dt) - m \times t.$$

In addition, since a computation circuit that depends on the design parameter m is not included in the parity code generator 500, m can also be extended to the extent permitted by the supplemental capacity dM1 in this same way. This is provided that extension amounts dm and dt, which satisfy the condition of the following equation, can be selected:

$$dM2 >= (m+dm) \times (t+dt) - m \times t.$$

For example, in a case where the supplemental capacity dM2 equals 16, since the value on the left side of the equation will be less than 16 when m+dm=9 and t+dt=7 (63−48=15), an extension can also be carried out such that dm=1 and dt=1. Thus, in a case where the FM controller 1400 is coupled to an external RAM 1440 with sufficient capacity, it is possible to generate a parity code that is capable of supporting a flash memory not matter what kind of error characteristics it has.

Next, input throughput of parity code generation by the FM controller 1400 and the hardware resources required for parity code generation will be explained by referring to FIG. 16. Furthermore, the throughput will be computed by regarding the drive clock frequency of the FM controller 1400 as 200 MHz.

Figure 16A:
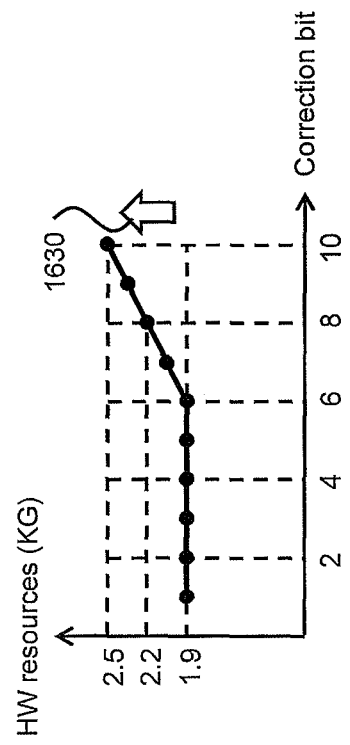
FIG. 16A is a diagram showing the input/output throughput (Mbps: megabits per second) of parity code generation corresponding to the number of correctable bits t of the FM controller 1400.

FIG. 16A is a diagram showing the input throughput (Mbps: megabits per second) of parity code generation in accordance with the number of correctable bits t of the FM controller 1400.

Figure 7:
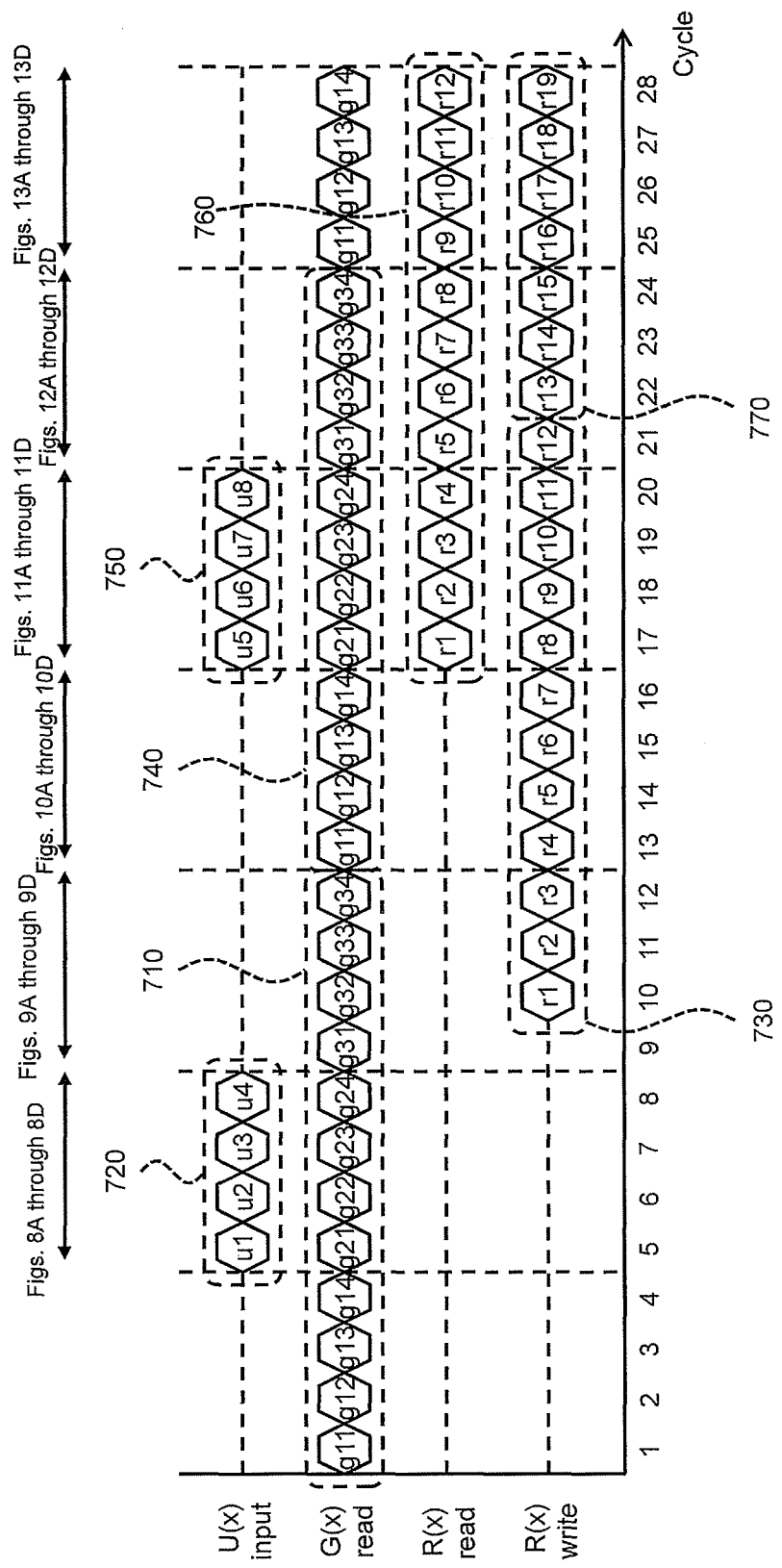
FIG. 7 shows an example of a transition diagram of input/output memory data in the generator 500 of FIG. 5.

When t=6, since processing is carried out by referencing the 16 bits of the user data U (=4 bits×4=W×N) for each 12 cycles as in u1 through u4 of FIG. 7, the input throughput becomes 16/12×200=267.77. Mbps. The input throughput is determined by cycle on which this 16-bit reference interval falls. This is obtained by multiplying N (=4) by the number of coefficient groups D of the generator polynomial G. When t=5, since D will be 3 in a case where m×t=40, similarly, the input throughput becomes 267 Mbps. When t is extended to 7 and 8 by using the external RAM to supplement the memory, since D will be 4 in cases where m×t equals both 56 and 64, the input throughput becomes 16/16×200=200 Mbps. When t is extended to 9 and 10, since D will be 5 in cases where m×t equals both 72 and 80, the input throughput becomes 16/20×200=160 Mbps.

That is, as indicated by arrow 1610, the input throughput decreases the more the number of correctable bits is extended when generating the parity code. Alternatively, in cases where t is 3 and 4, D becomes 2 and the input throughput becomes 16/8×200=400 Mbps. In cases where t is 1 and 2, D becomes 1 and the input throughput becomes 16/4×200=800 Mbps. In other words, as indicated by arrow 1620, the input throughput improves the smaller the number of correctable bits when generating a parity code.

Figure 16B:
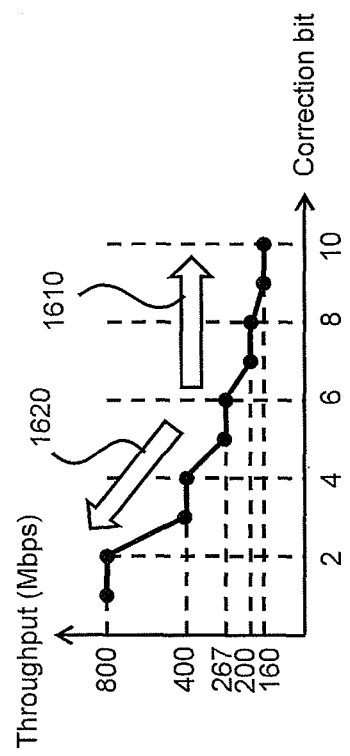
FIG. 16B is a diagram showing the hardware resources (KG: kilogates) required for parity code generation corresponding to the number of correctable bits t of the FM controller 1400.

FIG. 16B is a diagram showing the hardware resources (KG: kilogates) required for parity generation in accordance with the number of correctable bits t in the FM controller 1400.

In this drawing, the consumed capacities of the internal RAM and external RAM are included by being converted at 10 gates per bit. For the range t=1 through 6, there is no need for supplementation by the external RAM, and as such, the hardware resources are constant. When t is extended, the hardware resources rise in proportion to the capacity supplemented by the external RAM as indicated by arrow 1630. Since the coefficients of the generator polynomial G and the remainder polynomial R respectively increase by m (=8) bits each time t is extended one bit, the hardware resources rise eight bits×two types×10 gates=160 gates each.

The parity code generator has been explained hereinabove. When using this example, the number of error-correctable bits t can be extended for the parity code checker as well. In a case where the number of correctable bits of the parity code generator has been extended, the number of error-correctable bits of the parity code checker, which checks the generated parity code, must also be extended. A parity code checker for which the number of error-correctable bits has been extended will be explained below.

First, the parity code check step computation method with respect to the BCH code will be explained.

When expressing data stored in an FM chip 130 of FIG. 1 using a polynomial, the polynomial becomes a polynomial Y(x) of degree (k−1+m×t) by adding an error polynomial E(x) to a codeword polynomial V(x) that expresses the data at write time as in the following equation:

$$Y(x)=V(x)+E(x)=U(x)\times x^{mt}+R(x)+E(x).$$

In a case where an error has not occurred in the flash memory here, E(x)=0.

In order to determine whether or not an error has occurred, the parity code checker computes test values of t: $Y(a)$, $Y(a^3)$, $Y(a^5)$, ..., $Y(a^{2t-1})$ as an element a of a Galois field $GF(2^m)$. These test values will be called syndromes. These syndromes are expressed as:

$$S_1=Y(a)$$

$$S_2=Y(a^3)$$

$$S_3=Y(a^5)$$

$$\ldots$$

$$S_t=y(a^{2t-1}).$$

Here, yj=y1, y2, ... }, which is obtained by dividing an FM storage data polynomial Y(x) into multiple polynomials yj(x) of degree (W−1) (=third degree) and making these W (4) coefficients into a bit string similar to the user data polynomial U(x) in the parity code generator will be considered. Then, the parity code checking computation will be developed into a step computation method using the divided input of the FM storage data Y similar to the divided input of the user data U in the parity code generator. When we consider a case in which k=176, m=8, and t=8, Y(x) is a $239^{th}$ degree polynomial and j=1 through 60. That is, the FM storage data polynomial Y(x) is divided as follows:

$$Y(x)=t_{239}x^{239}y_{238}x^{238}+\ldots+y_1x+y_0$$

$$y1(x)=y_{239}x^3+y_{238}x^2+y_{237}x+y_{236}$$

$$y2(x)=y_{235}x^3+y_{234}x^2+y_{233}x+y_{232}$$

$$\ldots$$

$$y59(x)=y_7x^3+y_6x^2+y_5x+y_4$$

$$y60(x)=y_3x^3+y_2x^2+y_1x+y_0.$$

An operation circuit for updating a intermediate syndrome value $s_i$, which is obtained by multiplying $s_i$ by $a^{4(2i-1)}$ and adding $y(a^{2i-1})$ using the following $s_i$ will be considered:

$$s_i=s_i\times a^{4(2i-1)}+y(a^{2i-1}).$$

This is provided that i=1 through t (=8).

An ultimate syndrome $S_i=Y(a^{2i-1})$ can be generated by repeating the computation 60 times while sequentially applying yj(x) to the function y(x) of this circuit. The steps of this computation can be transcribed as follows:

START: $Y \rightarrow \{y1, y2, \ldots, y59, y60\}$

Step 1: $s_i=s_i\times a^{4(2i-1)}+y1(a^{2i-1})$

Step 2: $s_i=s_i\times a^{4(2i-1)}+y2(a^{2i-1})$ $\ldots$

Step 59: $s_i=s_i\times a^{4(2i-1)}+y59(a^{2i-1})$

Step 60: $s_i=s_i\times a^{4(2i-1)}+y60(a^{2i-1})$

END: $s_i=S_i=Y(a^{2i-1})$.

In the parity code checker according to this example, checks the parity code on the basis of these computation steps. First, N times the above-mentioned steps (for example, N=4) will be considered as one set. Next, t syndromes will be divided into D (=8/4=2) groups having this N as the unit. Then, the updating of the intermediate syndrome values inside this one set will be divided into D (=2) operations by each group. At this time, D×N=2×4=8 operations can be carried out for each set.

The parity code checker 1700 will be explained by referring to FIG. 17.

Figure 17:
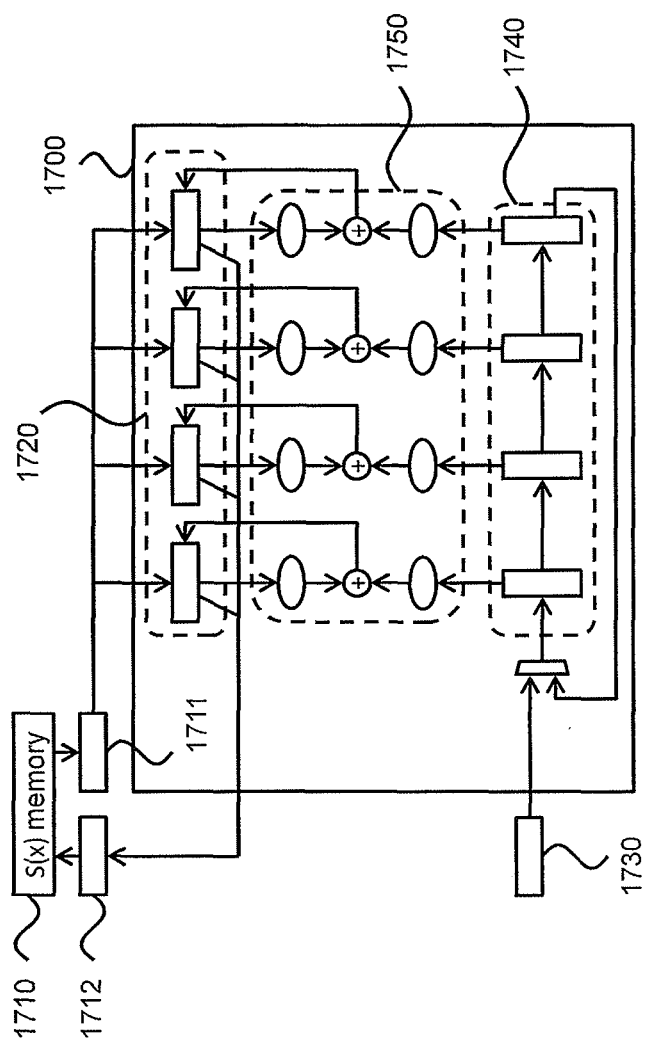
FIG. 17 shows an example of a block diagram of an error correction decoding device comprising a parity code checker 1700.

FIG. 17 shows an example of a block diagram comprising the parity code checker 1700.

The parity code checker 1700 is coupled to three data input/output registers. That is, the checker 1700 is coupled to Y input register 1730, a syndrome input register 1711, and a syndrome output register 1712. The Y input register 1730 may be referred to herein as a data input part, the syndrome input register 1711 may be referred to herein as an intermediate value input part, and the syndrome output register 1712 may be referred to herein as an intermediate value output part.

The Y input register 1730 is for receiving the storage data of the FM chips 130 shown in FIG. 1 via the FM bus 114, and supplying this storage data to the parity code checker 1700 as yj coefficients in W (=4) bit units.

An S(x) memory 1710 is for storing t (=8) intermediate syndrome values for each m bits (=8 bits), and is configured using RAM. The syndrome output register 1712, which is coupled to this S(x) memory 1710, is for storing the intermediate syndrome value outputted from the parity code checker 1700 in units of m bits (=8 bit) and writing this intermediate syndrome value to the S(x) memory 1710 in units of m bits (=8 bits). Similarly, the syndrome input register 1711, which is coupled to the S(x) memory 1710, is for receiving the intermediate syndrome value read from the S(x) memory 1710 in units of m bits (=8 bits), and inputting this intermediate syndrome value to the parity code checker 1700 in units of m bits (=8 bits). Since these reads are generated simultaneously (substantially simultaneously), specifically speaking, the S(x) memory 1710 is a RAM comprising dual ports.

The parity code checker 1700 comprises an update operation circuit 1750, which is able to update N (=4) intermediate syndrome values s, simultaneously (substantially simultaneously) in accordance with the above-cited equation, and two types of registers, i.e., a syndrome register 1720, and a Y reference shift register 1740, are provided in the periphery of the parity code checker 1700. The update operation circuit 1750 may be referred to herein as a second operation part.

The syndrome register 1720 is an 8 bit×4 (m bits×N) register capable of storing N (=4) intermediate syndrome values. The parity code checker 1700 stores the intermediate syndrome values ($s_1$ through $s_8$) sequentially read from the S(x) memory 1710 in the syndrome register 1720 during N (=4) cycles. During this period, the update operation circuit 1750 computes N (=4) steps of the above-mentioned steps and writes the results thereof to the S(x) memory 1710.

The Y reference shift register 1740 is a 4 bit×4 (W bits×N) register coupled to the Y input register 1730. N (=4) of the coefficients of yj, which are referenced by the update operation circuit 1750, are provided to the update operation circuit 1750 simultaneously (substantially simultaneously). Since the reference timing changes for each reference, this register constitutes a shift register configuration.

Figure 18:
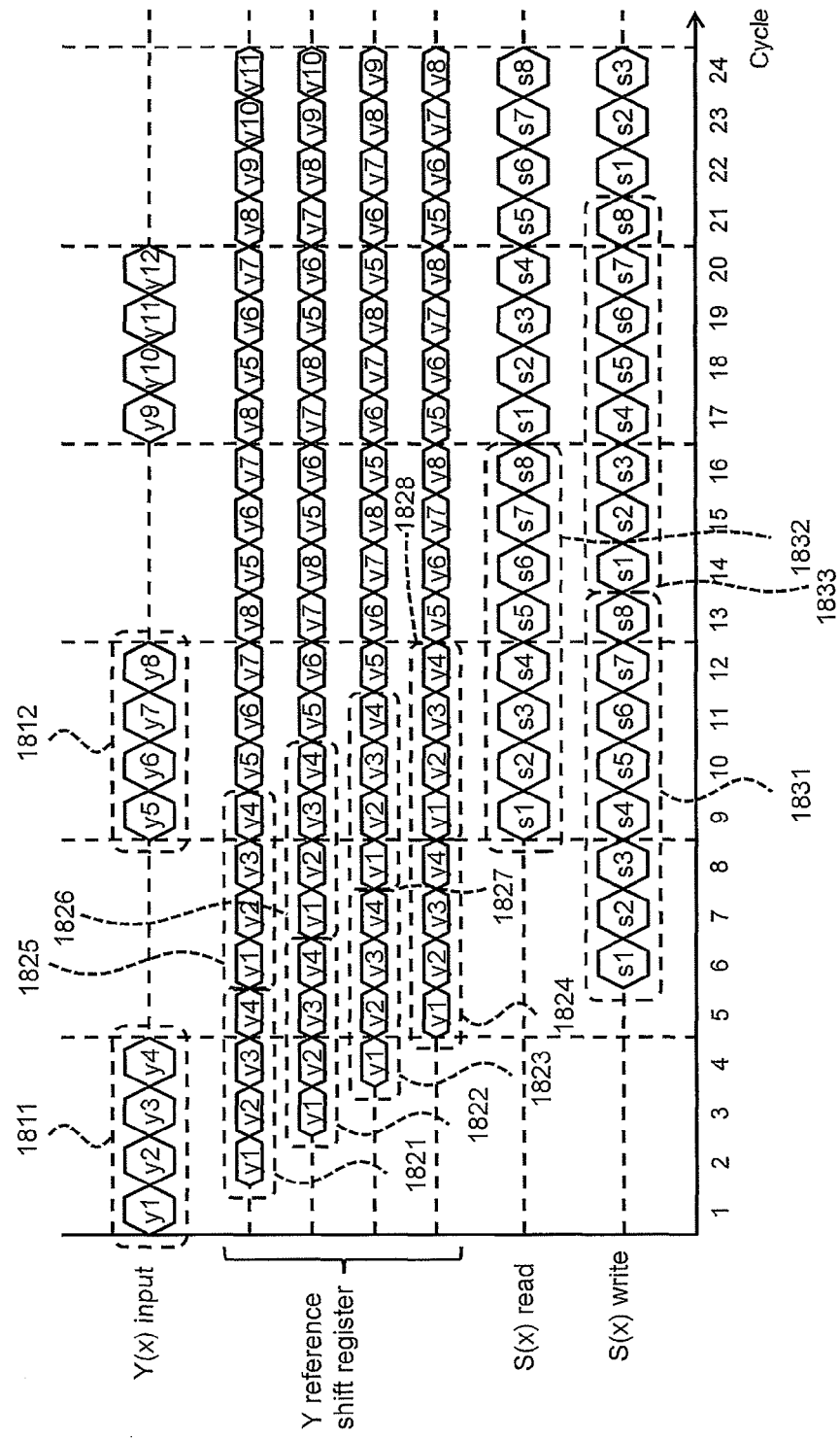
FIG. 18 shows an example of a transition diagram of input/output memory data and internal registers in the parity code checker 1700.

FIG. 18 shows an example of a transition diagram of input/output memory data and internal registers in the parity code checker 1700.

The manner in which three types of data input/output (the input of FM storage data Y, and the input/output of a intermediate syndrome value S) and the contents of the Y reference shift register 1740 transition when the parity code checker 1700 executes the method for generating a syndrome of this example, will be described by referring to FIG. 18.

First, in the first through the fourth cycles, the 16 bits of y1 through y4 of the FM storage data Y are sequentially inputted to the parity code checker 1700 four bits at a time (1811). In the second through the fifth cycles, y1 through y4 are sequentially stored in one of the Y reference shift registers 1740 (1821), and are referenced by an intermediate syndrome value $s_1$ update operation. In the third through the sixth cycles, y1 through y4 are sequentially stored in one of the Y reference shift registers 1740 (1822), and are referenced by an intermediate syndrome value $s_2$ update operation. In the fourth through the seventh cycles, y1 through y4 are sequentially stored in one of the Y reference shift registers 1740 (1823), and are referenced by an intermediate syndrome value $s_3$ update operation. In the fifth through the eighth cycles, y1 through y4 are sequentially stored in one of the Y reference shift registers 1740 (1824), and are referenced by an intermediate syndrome value $s_4$ update operation. In the sixth through the ninth cycles, y1 through y4 are sequentially stored in one of the Y reference shift registers 1740 (1825), and are referenced by an intermediate syndrome value $s_5$ update operation. In the seventh through the $10^{th}$ cycles, y1 through y4 are sequentially stored in one of the Y reference shift registers 1740 (1826), and are referenced by an intermediate syndrome value $s_6$ update operation. In the eighth through the $11^{th}$ cycles, y1 through y4 are sequentially stored in one of the Y reference shift registers 1740 (1827), and are referenced by an intermediate syndrome value $s_7$ update operation. In the ninth through the $12^{th}$ cycles, y1 through y4 are sequentially stored in one of the Y reference shift registers 1740 (1828), and are referenced by an intermediate syndrome value $s_8$ update operation. In the sixth through the $13^{th}$ cycles, the intermediate syndrome values $s_1$ through $s_8$, which are the results of the above-mentioned operations, are outputted to the S(x) memory 1710. Steps 1 through 4 have been respectively executed above for eight syndromes up to this point.

Next, in the ninth through the $12^{th}$ cycles, the 16 bits of y5 through y8 of the FM storage data Y is sequentially inputted to the parity code checker 1700 four bits at a time (1812). Furthermore, in the ninth through the $16^{th}$ cycles, the intermediate syndrome values $s_1$ through $s_8$, which were written to the S(x) memory 1710, are sequentially inputted to the parity code checker 1700 to be updated in accordance with y5 through y8 (1832). These intermediate syndrome values $s_1$ through $s_8$ are updated by the update operation circuit 1750 while the y5 through y8 are being shifted in the Y reference shift register 1740. In the $14^{th}$ through the $21^{st}$ cycles, the intermediate syndrome values $s_1$ through $s_8$, which are the results of this operation, are outputted to the S(x) memory 1710 (1833). Steps 5 through 8 have been respectively executed for eight syndromes up to this point.

Thus, the parity code checker 1700 executes operations while referencing the FM storage data Y, which is inputted 16 bits at a time during four cycles out of eight cycles, and ultimately computes a syndrome $S_i$ by writing/reading the intermediate syndrome values computed every eight cycles to/from the S(x) memory 1710 eight bits at a time.

The FM controller, which comprises the parity code checker 1700 of this example, is equipped with RAM corresponding to the S(x) memory 1710, and generates a syndrome by inputting/outputting intermediate syndrome values to/from these RAMs and the parity code checker 1700.

Now then, in the above explanation, the capacity of the S(x) memory 1710 was 64 (=m×t=8×8) bits, but a case in which the capacity of the memory 1710 is supplemented by another memory (for example, the external RAM) will be considered here. Then, a case in which the number (=t) of syndromes capable of being generated is able to be extended by making it appear to the parity code checker 1700 that the capacity of the internal RAM is larger than 64 bits will be explained. This signifies that, while the capacity of the parity code checker 1700 remains the same, extending the value of t makes it possible to check a parity code even for a flash memory that requires a larger number of error-correctable bits (t) than was assumed at the design stage.

Figure 19:
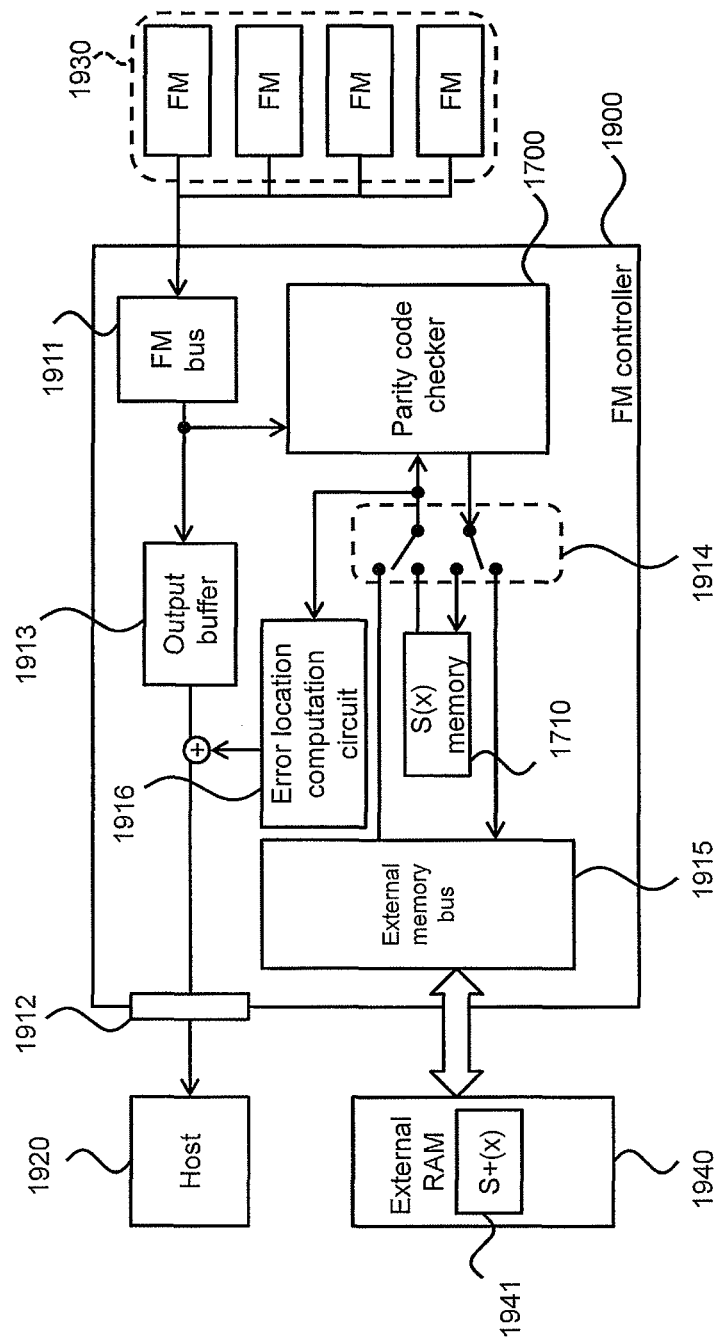
FIG. 19 shows an example of a block diagram of a system, which comprises an electronic device comprising an FM controller 1900.

FIG. 19 shows an example of a block diagram of a system, which comprises an electronic device comprising a FM controller 1900.

This electronic device is a variation of the electronic device shown in FIG. 1. A method for extending the number of error-correctable bits t in the FM controller 1900, which comprises a parity code checker 1700, will be explained by referring to FIG. 19.

The FM controller 1900 is a semiconductor chip comprising a microprocessor for controlling a flash memory in accordance with an embedded program, and peripheral logic circuits, the same as the FM controller 100 of FIG. 1.

The peripheral logic circuits include the parity code checker 1700 shown in FIG. 17, a FM bus 1911, a host interface 1912, an output buffer 1913, a memory path switch 1914, an external memory bus 1915, and an error location computation circuit 1916. In addition, the internal RAM-configured S(x) memory 1710 shown in FIG. 17 is also included.

The FM controller 1900 is coupled to an external host 1920 via the host interface 1912, and is coupled to one or more external FMs 1930 via the FM bus 1911.

The FM bus 1911, the host interface 1912, and the output buffer 1913 are the same as the FM bus 114, the host interface 112, and the output buffer 117 of FIG. 1, and as such, explanations will be omitted.

The FM controller 1900 is coupled to an external RAM 1940 (for example, DRAM), which is outside of the FM controller 1900, via the external memory bus 1915. The external RAM 1940 may be either inside or outside of the FM package that comprises the FM controller 1900.

The external RAM 1940 may be a SRAM (Static RAM) or the like as long as the memory is capable of reading and writing data randomly.

An area for storing a portion of the intermediate syndrome values: $S_+(x)$ area 1941 is allocated inside the external RAM 1940.

The memory path switch 1914 selects either the S(x) memory 1710 or the $S_+(x)$ area 1941 as the supply destination of the intermediate syndrome values outputted from the parity code checker 1700 and/or the supply source of the intermediate syndrome values inputted to the parity code checker 1700.

During an operation in which the number of error-correctable bits t is not extended, the memory path switch 1914 is fixed in the state that selects the S(x) memory 1710 at all times. However, during an operation in which the number of error-correctable bits t is extended, the memory path switch 1914 switches over to select the $S_+(x)$ area 1941 at a decided time.

Figure 20:
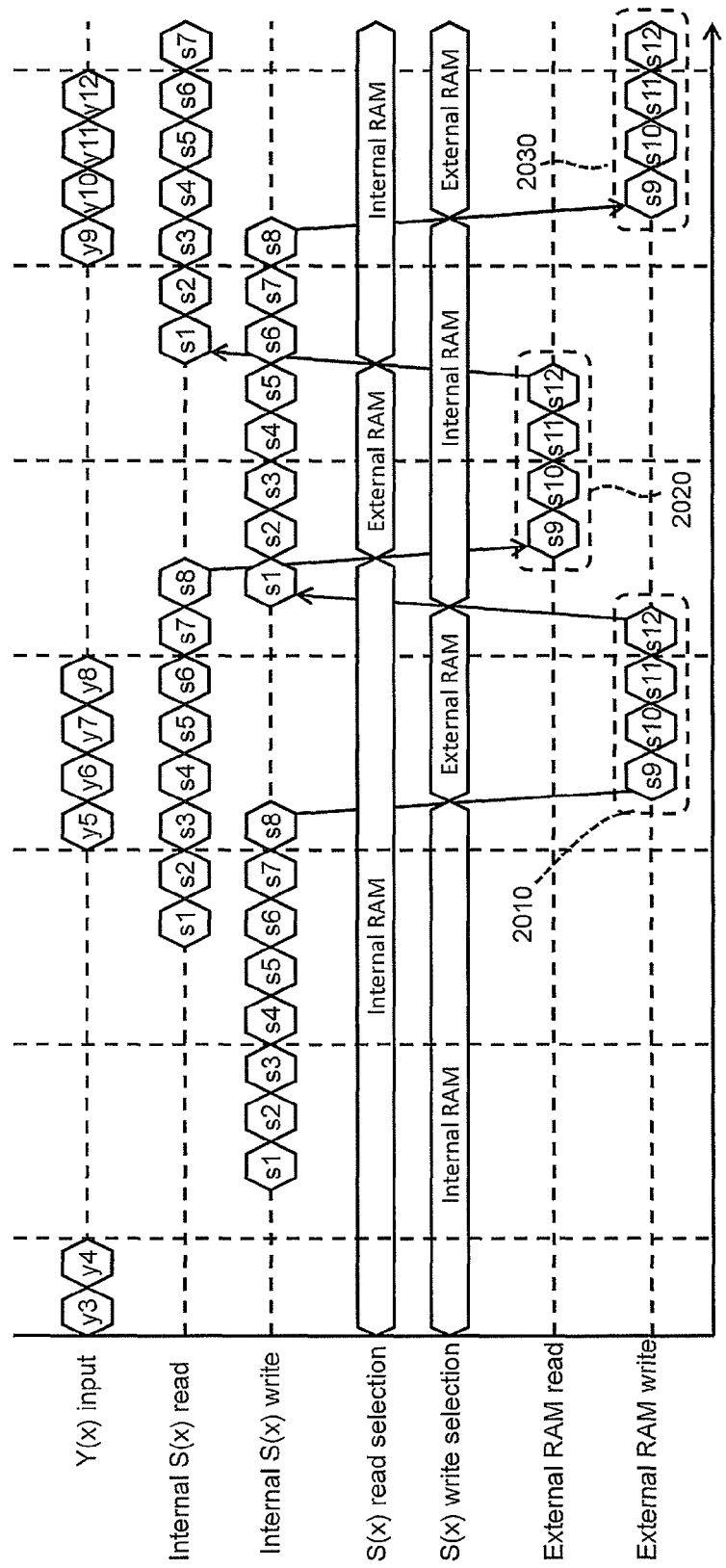
FIG. 20 shows an example of a transition diagram of input/output memory data and memory selection signals in the FM controller 1900.

FIG. 20 shows an example of a transition diagram of input/output memory data and memory selection signals in the FM controller 1900.

A selection switching method of the memory path switch 1914 at the time of an operation to extend the number of error-correctable bits t will be described by referring to FIG. 20. A case in which the number of error-correctable bits t is extended from the eight bits used in the explanation up to this point to 12 bits, that is, by four bits, will be considered.

In accordance with this extension, the number of intermediate syndrome values will become 12, and a m×(t+dt)=8×(8+4)=96-bit memory will be needed for storage. Since the S(x) memory 1710 is 64 bits, the remaining 32 bits will be supplemented using the $S_+(x)$ area 1941 of the external RAM 1940. The intermediate syndrome values, which have been increased in accordance with the extension, are expressed as {s9, s10, s11, s12}, and a 32-bit storage destination therefor is allocated in the $S_+(x)$ area 1941.

FIG. 20 shows how three types of data input/output (the input of FM storage data Y, and the input/output of a intermediate syndrome value $s_i$) of the parity code checker 1700, the state of the memory path switch 1914, and the data input/output of the external RAM 1940 transition.

The dotted-line box 2010 of FIG. 20 shows how {s9, s10, s11, s12}, which are not in the S(x) memory 1710, are written from among the computed intermediate syndrome values to the $S_+(x)$ area 1941 by the memory path switch 1914 selecting the external RAM 1940 as the S(x) write destination.

The dotted-line box 2020 of FIG. 20 shows how {s9, s10, s11, s12}, which are not in the S(x) memory 1710, are read from among the intermediate syndrome values from the $S_+(x)$ area 1941 by the memory path switch 1914 selecting the external RAM 1940 as the S(x) read source.

The dotted-line box 2030 of FIG. 20 shows how {s9, s10, s11, s12}, which are not in the S(x) memory 1710, are written from among the updated intermediate syndrome values to the $S_+(x)$ area 1941 by the memory path switch 1914 selecting the external RAM 1940 as the S(x) write destination.

As described hereinabove, the FM controller 1900, which comprises the parity code checker 1700 and the memory path switch 1914, can extend the number of error-correctable bits t by dt in accordance with the supplemental capacity dM3 thereof by allocating an area for supplementing the intermediate syndrome values in the external RAM 1940, which is coupled externally thereto. This is provided that a dt that satisfies the condition of the following equation can be selected:

$$dM3 >= m\times(t+dt)-m\times t.$$

Thus, in a case where the FM controller 1900 is coupled to an external RAM 1940 with sufficient capacity, it is possible to check a parity code not matter what the number of error-correctable bits t.

The parity code checker according to this example has been explained hereinabove.

However, a storage apparatus comprising multiple physical storage devices is known, and the FM package 1300 mentioned hereinabove can be used as the physical storage device.

Figure 21:
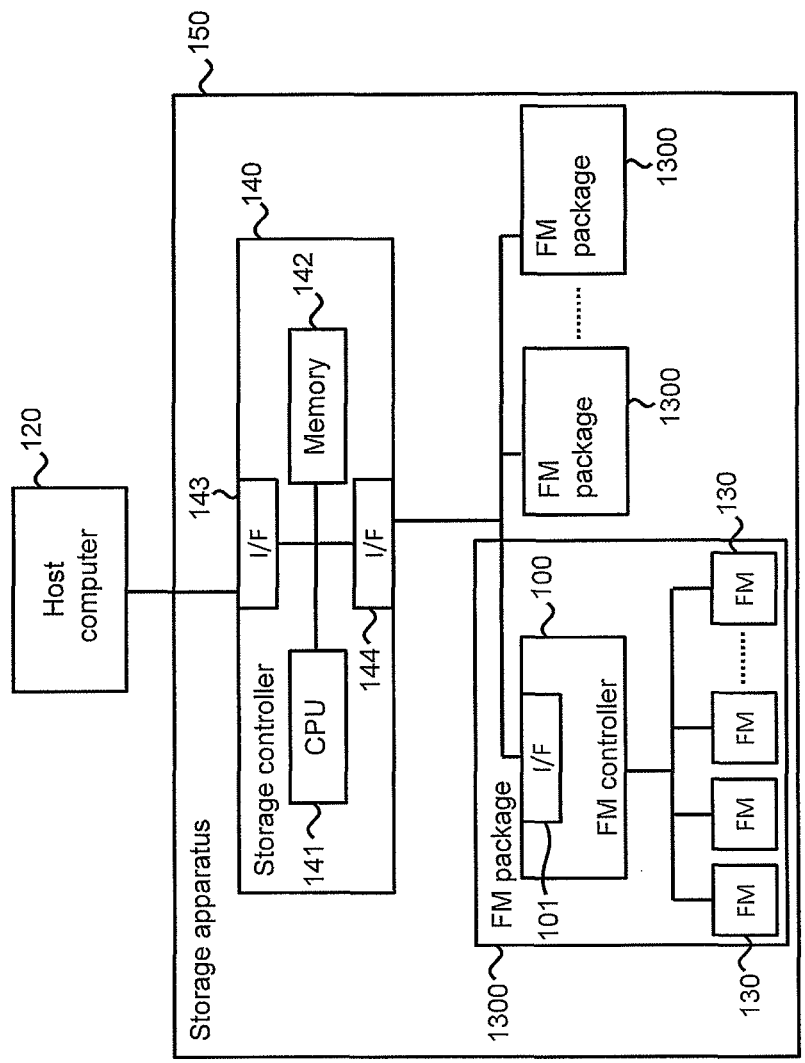
FIG. 21 shows an example of the configuration of a storage device 150 comprising FM packages 1300 related to this example.

FIG. 21 shows an example of the configuration of a storage apparatus 150 comprising a FM package 1300 related to this example.

The storage apparatus 150 related to this example comprises a storage controller 140 and multiple FM packages 1300, which are coupled to the storage controller 140. According to this storage apparatus 150, the storage controller 140, which is at a higher level than the FM controller 100 in the FM package 1300, is coupled to the host computer 120 via, for example, a communication network (for example, a SAN (Storage Area Network)) rather than the FM controller 100. The storage controller 140 may function as the host of the FM controller 100 here.

One or more RAID (Redundant Array of Independent (or Inexpensive) Disks) groups may be configured using the multiple FM packages 1300. Each RAID group may be configured from two or more FM packages 1300. Either one or multiple logical volumes may be formed based on a RAID group.

The storage controller 140 comprises a CPU (Central Processing Unit) 141, a memory 142, and I/Fs (Interfaces) 143 and 144. The I/F 143 is coupled to the host computer 120, and the I/F 144 is coupled to the FM package 1300.

The memory 142 stores various programs. The CPU 141 realizes various functions by executing the various programs stored in the memory 142. Furthermore, the memory 142 may be used as the external RAM 1440 shown in FIG. 14 and/or as the external RAM 1940 shown in FIG. 19.

The storage controller 140 may provide a logical volume to the host computer 120. The logical volume may be a virtual logical volume, or may be a substantial logical volume. The virtual logical volume may be a logical volume that conforms to Thin Provisioning, or may be a logical volume based on one or more logical volumes of an external storage apparatus (not shown in the drawing). The substantial logical volume may be a logical volume based on a RAID group, which has been configured using two or more FM packages 1300.

The storage controller 140 receives a write command from the host computer 120, and stores write-target data conforming to this write command in the memory 142 temporarily. Thereafter, the storage controller 140 sends a write command to one or more FM packages 1300 identified based on an address specified by this write command for writing data (for example, either all or a portion of the write-target data, or parity data obtained in accordance with a RAID computation) based on the write-target data inside the memory 142. In the write command sent from the storage controller 140 to the FM package 1300, there is specified an address, which is based on the address specified by the write command that the storage controller 140 received from the host computer 120. In accordance with this, the write-target data is written to one or more FM packages 1300.

Furthermore, the storage controller 140 receives a read command from the host computer 120, and sends a read command for reading data (for example, either all or a portion of read-target data, or parity data) based on read-target data that conforms to this read command to the FM package 1300 identified on the basis of an address specified in this read command. In the read command sent from the storage controller 140 to the FM package 1300, an address based on the address specified in the read command, which the storage controller 140 received from the host computer 120, is specified. The read-target data is stored in the memory 142 based on the data read from one or more FM packages 1300. The storage controller 140 sends the read-target data in the memory 142 to the host computer 120.

The FM package 1300, as was described hereinabove, comprises a FM controller 100 and one or more FM chips 130. The FM controller 100 is coupled to the storage controller 140 via an I/F 101. The FM controller 100 comprises the parity code generator 500 and the parity code checker 1700. The FM controller 100 uses the parity code generator 500 to generate a parity code related to the data sent from the storage controller 140, and writes the data sent from the storage controller 140 to the FM package 1300 together with the generated parity code. Furthermore, the FM controller 100 reads data from the FM package 1300 relative to a read request from the storage controller 140, and uses the parity code checker 1700 to check the parity code of the read data. In a case where the result of the check is that there are no abnormalities in the parity code, the FM controller 100 sends the read data to the storage controller 140.

An example of the embodiment has been described hereinabove, but a memory controller comprising an error correction coding/decoding circuit in accordance with this example is not limited to flash memory error correction, but rather is applicable to error correction in any nonvolatile semiconductor memory. For example, this holds true for phase change memory, magnetoresistive memory, resistance memory, and ferroelectric memory. Of course, the present invention is also applicable to error correction in volatile semiconductor memory such as DRAM by mounting a semiconductor chip comprising this circuit on a DIMM (Dual Inline Memory Module) for use in a computer system, or peripheral thereto (on the motherboard or the like).

Furthermore, most of these semiconductor memory chip products are configured so as to enable memory-related information (model number, capacity, and so forth) to be read from the chip itself in accordance with a command. Accordingly, the memory controller may be designed so as to be able to detect the error characteristics of this memory by the memory controller reading this related information. By designing the memory controller like this, it is clear whether a parity code can be generated for this memory and whether the parity code can be checked even in a case where the number of error-correctable bits has been extended. Furthermore, it is also possible to use a program embedded in the microprocessor to implement processing for automatically computing an external memory supplemental capacity needed for extension, and to allocate a dedicated external memory area for this purpose.

Furthermore, the error correction coding/decoding circuit according to this example is also applicable to a network communication system. For example, it is also possible to mount the error correction coding/decoding circuit according to this example to a microcontroller chip inside a communication apparatus. In a case where the communication environment is worse than was imagined at design time, an external memory can be connected afterwards, and a parity code generator/checker for extending the number of error-correctable bits t can be applied. This makes it possible to reduce the error rate of communication data, and to maintain the communication throughput required by the communication apparatus. The communication apparatus vendor can avoid the cost of remanufacturing the microcontroller chip.

REFERENCE SIGNS LIST 100, 1400, 1900 FM controller
111, 500 Parity code generator
112, 1412, 1912 Host interface
114, 1411, 1911 FM bus
115, 1700 Parity code checker
130, 1430, 1930 FM chip
511 Parity code input register
512 Parity code output register
521 Generator polynomial input register
530 Intermediate value register
540 Quotient computation circuit
550 Generator polynomial shift register
560 Generator polynomial reference register
570 User data input register
580 Quotient shift register
590 Partial product computation circuit
1414, 1914 Memory path switch
1440, 1940 External RAM
1441 $R_+(x)$ area
1442 $G_+(x)$ area
1711 Syndrome input register
1712 Syndrome output register
1720 Syndrome register
1730 Y input register
1740 Y reference shift register
1750 Update operation circuit
1941 $S_+(x)$ area

The invention claimed is:

1. An electronic device comprising an error correction coding device, which comprises a parity code generator for computing a remainder polynomial by dividing a user data polynomial by a generator polynomial and generating a parity code from the remainder polynomial, wherein the parity code generator comprises:

an input part for dividing and inputting either a first bit string comprising coefficients of the generator polynomial or the first bit string and a second bit string comprising of the user data polynomial;

a first operation part for computing the remainder polynomial by splitting a division operation into multiple division operations based on either a division width of the user data polynomial or a division width of the user data polynomial and the generator polynomial; and a first output part for outputting a third bit string comprising coefficients of the remainder polynomial, which is a result of the division by the first operation part.

2. The electronic device according to claim 1, wherein the error correction coding device is configured to, in a BCH code (Bose Chaudhuri Hocqueghem code), which is defined using a Galois field having an element of $2^m$, where m is an integer of equal to or larger than 1, and corrects t errors, where t is an integer of equal to or larger than 1, the generator polynomial is a generator polynomial of degree mt, which is determined from the parameters m and t that are required in accordance with error characteristics of a recording medium, and the error correction coding device computes a remainder polynomial of degree (mt−1) by dividing the user data polynomial of degree (k−1), which is generated by this generator polynomial from user data of k bits, which satisfies a following expression:

$k<2^m-m\times t$, where k is an integer of equal to or larger than 1 and generates a parity code of mt bits from coefficients of the computed remainder polynomial, wherein the input part includes a first input part for dividing a fourth bit string comprising coefficients of the user data polynomial by W bits and inputting the divided fourth bit string, and a second input part for inputting the first bit string, and the first operation part carries out following processing:

(A) computes a partial remainder polynomial, which is a portion of the remainder polynomial for computing a portion of the remainder polynomial by using the generator polynomial to divide the inputted W-bit user data, and in a case where the partial remainder polynomial has been computed, uses this computed partial remainder polynomial when dividing the subsequently inputted W-bit user data polynomial by the generator polynomial;

(B) repeatedly executes the (A) operation k/W times, and computes k/W partial remainder polynomials;

(C) computes the remainder polynomial from the k/W partial remainder polynomials computed in the (B); and (D) computes the parity code from the remainder polynomial computed in the (C) operation.

3. The electronic device according to claim 2, wherein the first input part divides and inputs the generator polynomial in N portions, where N is an integer of equal to or larger than 2, and the first operation part computes k/W partial remainder polynomials by computing the (B) operation N times as one set, and further repeating this operation k/NW sets.

4. The electronic device according to claim 3, wherein the second input part divides and inputs the generator polynomial to the first operation part D bits at a time, where D=mt/NW, and the first operation part computes k/W partial remainder polynomials by computing the (B) operation N×D times as one set, and further repeating this operation k/NW times.

5. The electronic device according to claim 2, wherein the first operation part substantially simultaneously carries out inputting of the partial remainder polynomials used for computing the remainder polynomial, and outputting the computed partial remainder polynomials.

6. The electronic device according to claim 2, wherein the first operation part substantially simultaneously carries out inputting of the partial remainder polynomials required in computation, and inputting of the partial remainder polynomials required in computation of another computing the remainder polynomial.

7. The electronic device according to claim 2, wherein the first operation part comprises a register for storing multiple quotients, which are the results of divisions by the generator polynomial, and the first operation part uses one of the multiple quotients stored in the register to carry out the computation of the partial remainder polynomials.

8. The electronic device according to claim 2, comprising:

an error correction decoding device, which comprises a parity code checker for correcting an error in data comprising the user data and the parity code assigned to the user data, wherein the parity code checker comprises:

a data input part for dividing and inputting a fifth bit string of the data from outside of the electronic device;

a second operation part, which computes an intermediate syndrome value for computing a syndrome from the divided and inputted the fifth bit string;

an intermediate value output part for outputting the intermediate syndrome value to the outside of the electronic device; and an intermediate value input part for inputting the intermediate syndrome value from the outside, the second operation part computes the syndrome by computing another intermediate syndrome value using the computed intermediate syndrome value.

9. The electronic device according to claim 1, wherein the parity code generator comprises a first memory for storing the generator polynomial, and a second memory for storing the remainder polynomial, the error correction coding device comprises on an outside of the parity code generator a first external memory for storing the generator polynomial, and a second external memory for storing the remainder polynomial, and the first and second external memories are coupled to the parity code generator.

10. The electronic device according to claim 9, comprising:

a first external memory bus, which is coupled to the first external memory;

and a first switching circuit for switching an input source of the generator polynomial to the first external memory via either the first memory or the first external memory bus.

11. The electronic device according to claim 9, comprising:

a second external memory bus, which is coupled to the second external memory; and a second switching circuit for switching an input source of the remainder polynomial to the second external memory via either the second memory or the second external memory bus.

12. The electronic device according to claim 9, comprising:
an external memory bus for inputting the generator polynomial from the first external memory, outputting the remainder polynomial to the second external memory, and inputting the remainder polynomial from the second external memory; and
a switching circuit, which carries out at least one of controls from among (a) switching the input source of the generator polynomial to either the first memory or the external memory bus, (b) switching an output destination of the remainder polynomial to either the second memory or the external memory bus, and (c) switching the input source of the remainder polynomial to either the second memory or the external memory bus.

13. An error correction coding device, which comprises a parity code generator for computing a remainder polynomial by dividing a user data polynomial by a generator polynomial, and generating a parity code from the remainder polynomial, wherein the parity code generator comprises:

an input part for dividing and inputting either a first bit string comprising coefficients of the generator polynomial or the first bit string and a second bit string comprising coefficients of the user data polynomial; and an operation part for computing the remainder polynomial by splitting a division operation into multiple division operations based on either a division width of the user data polynomial or a division width of the user data polynomial and the generator polynomial.

* * * * *